(12) United States Patent
Merryman et al.

(10) Patent No.: US 6,718,520 B1
(45) Date of Patent: Apr. 6, 2004

(54) METHOD AND APPARATUS FOR SELECTIVELY PROVIDING HIERARCHY TO A CIRCUIT DESIGN

(75) Inventors: Kenneth E. Merryman, Fridley, MN (US); Ted G. Lautzenheiser, Forest Lake, MN (US); Michael K. Engh, Wayzata, MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 08/789,703

(22) Filed: Jan. 27, 1997

(51) Int. Cl.[7] .......................... G06F 9/45; G06F 9/455; G06F 17/50
(52) U.S. Cl. .............. 716/1; 703/13; 703/14; 703/15; 716/8; 716/9; 716/10; 716/11; 716/12; 716/13; 716/14
(58) Field of Search ................. 364/488, 489, 364/490, 491; 716/1, 8–14; 703/13–15

(56) References Cited

U.S. PATENT DOCUMENTS

| | | |
|---|---|---|
| 4,580,228 A | 4/1986 | Noto |
| 4,686,629 A | 8/1987 | Noto et al. |
| 4,758,953 A | 7/1988 | Morita et al. |
| 4,815,003 A | 3/1989 | Putatunda et al. |
| 4,831,543 A | 5/1989 | Mastellone |
| 4,918,614 A | 4/1990 | Modarres et al. |
| 5,050,091 A | 9/1991 | Rubin |
| 5,164,908 A | 11/1992 | Igarashi |
| 5,175,696 A | 12/1992 | Hooper et al. |
| 5,222,029 A | 6/1993 | Hooper et al. |
| 5,224,056 A | 6/1993 | Chene et al. |
| 5,237,514 A | 8/1993 | Curtin |
| 5,255,363 A | 10/1993 | Seyler |
| 5,267,175 A | 11/1993 | Hooper |
| 5,267,176 A | 11/1993 | Antreich et al. |
| 5,301,318 A * | 4/1994 | Mittal ........................... 717/1 |
| 5,311,443 A | 5/1994 | Crain et al. |

(List continued on next page.)

OTHER PUBLICATIONS

Carl Sechen, "VLSI Placement and Global Routing Using Simulated Annealing", Kluwer Academic Publishers, 1988, pp. 1–19.

R. E. Massara, Ed. "Design and Test Techniques for VLSI and WSI Circuits", Peter Peregrinus, Ltd., 1989, pp. 14–27.

Primary Examiner—Hugh Jones
(74) Attorney, Agent, or Firm—Charles A. Johnson; Mark T. Starr; Nawrocki, Rooney & Sivertson PA

(57) ABSTRACT

A method and apparatus for selectively providing hierarchy to a circuit design. The present invention contemplates providing a number of hierarchical statements in a description of a circuit design, wherein the syntax of the hierarchical statements allows the hierarchical statements to be visible when providing a first representation of the circuit design and effectively invisible when providing a second representation of the circuit design.

30 Claims, 19 Drawing Sheets

U.S. PATENT DOCUMENTS

| | | | |
|---|---|---|---|
| 5,341,309 A | 8/1994 | Kawata | |
| 5,349,536 A | 9/1994 | Ashtaputre et al. | |
| 5,349,659 A | 9/1994 | Do et al. | |
| 5,355,317 A | 10/1994 | Talbott et al. | |
| 5,357,440 A | 10/1994 | Talbott et al. | |
| 5,359,523 A | 10/1994 | Talbott et al. | |
| 5,359,537 A | 10/1994 | Saucier et al. | |
| 5,361,357 A | 11/1994 | Kionka | |
| 5,363,313 A | 11/1994 | Lee | |
| 5,398,195 A | 3/1995 | Kim | |
| 5,406,497 A | 4/1995 | Altheimer et al. | |
| 5,416,721 A | 5/1995 | Nishiyama et al. | |
| 5,418,733 A | 5/1995 | Kamijima | |
| 5,418,954 A | 5/1995 | Petrus | |
| 5,440,720 A | 8/1995 | Baisuck et al. | |
| 5,483,461 A | 1/1996 | Lee et al. | |
| 5,485,396 A | 1/1996 | Brasen et al. | |
| 5,490,266 A | 2/1996 | Sturges | |
| 5,490,268 A | 2/1996 | Matsunaga | |
| 5,491,640 A | 2/1996 | Sharma et al. | |
| 5,493,508 A | 2/1996 | Dangelo et al. | |
| 5,541,850 A * | 7/1996 | Vander Zanden et al. | 364/491 |
| 5,544,067 A * | 8/1996 | Rostoker et al. | 364/489 |
| 5,555,201 A * | 9/1996 | Dangelo et al. | 716/1 |
| 5,751,592 A * | 5/1998 | Takai et al. | 364/488 |
| 5,754,826 A * | 5/1998 | Gamal et al. | 364/490 |
| 5,790,416 A * | 8/1998 | Norton et al. | 716/11 |
| 5,805,860 A * | 9/1998 | Parham | 716/12 |

* cited by examiner

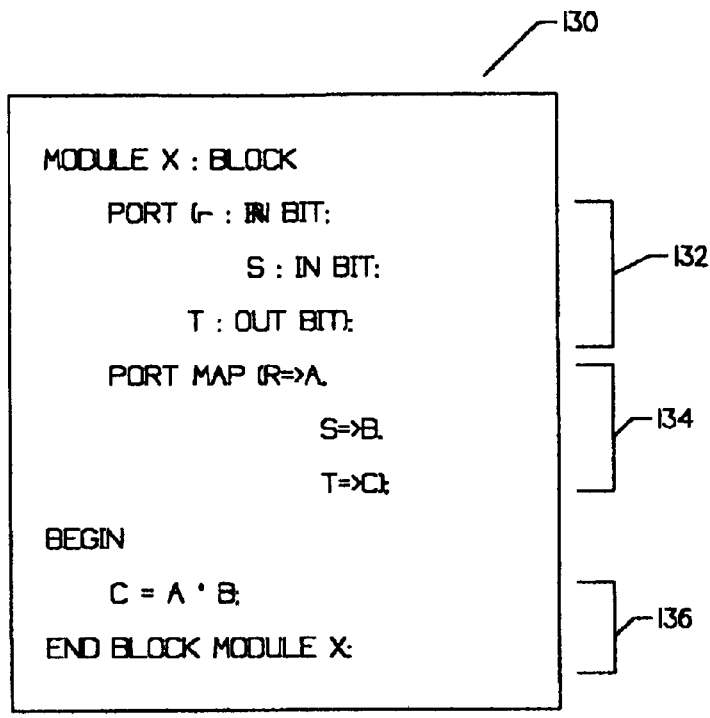
OR
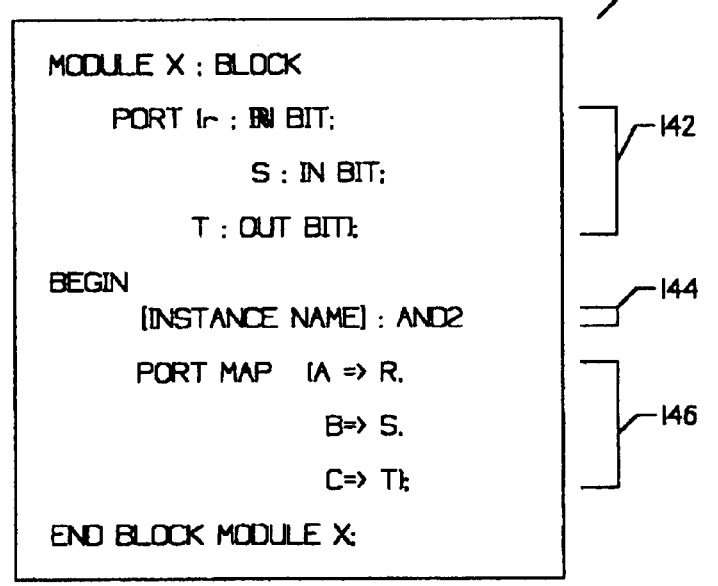
FIG. 6B

TEST VECTORS FOR COMPONENT AND2 /150

A <= 0;
B <= 0;
IF (C = 1) THEN ISSUE ERROR;
B <= 1;
IF (C = 1) THEN ISSUE ERROR;
B <= 0;
A <= 1;
IF (C = 1) THEN ISSUE ERROR;
B <= 1;
IF (C = 0) THEN ISSUE ERROR;

TEST VECTORS FOR COMPONENT MODX /152

R <= 0;
S <= 0;
IF (T = 1) THEN ISSUE ERROR;
S <= 1;
IF (T = 1) THEN ISSUE ERROR;
S <= 0;
R <= 1;
IF (T = 1) THEN ISSUE ERROR;
S <= 1;
IF (T = 0) THEN ISSUE ERROR;

FIG. 6C

METHOD AND APPARATUS FOR SELECTIVELY PROVIDING HIERARCHY TO A CIRCUIT DESIGN

CROSS REFERENCE TO CO-PENDING APPLICATIONS

The present application is related to U.S. patent application Ser. No. 08/789,024, filed Jan. 27, 1997, entitled "A Method of Stabilizing Component and Net Names of Integrated Circuits In Electronic Design Automation. Systems", and U.S. patent application Ser. No. 08/789,702, filed Jan. 27, 1997, entitled "Method and Apparatus for Providing Modularity to a Behavioral Description of a Circuit Design", which are assigned to the assignee of the present invention, and are incorporated herein by reference.

BACKGROUND OF THE INVENTION

1. Field of the Invention

This invention relates generally to electronic design automation (EDA) systems used for designing integrated circuits. The invention is more particularly related to a method for selectively providing hierarchy to a circuit design during the integrated circuit design process.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system.

More particularly, the design entry operation involves generating a description of the logic design to be implemented on the circuit chip in an appropriate machine-readable form. A common method for specifying the integrated circuit design is the use of hardware description languages (HDL). This method allows a circuit designer to specify the circuit at the register transfer level (also known as a "behavior description"). Using this method, the circuit is defined in small building blocks. The names of the building blocks are specified by the circuit designer. Thus, they usually have logical names with specific functional meaning.

Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

After the behavioral description is entered, the circuit designer typically simulates and verifies that the behavioral description correctly models the desired function. This is often accomplished using a HDL logic simulator. The HDL logic simulator may read the behavioral description, or a compiled version thereof, and simulate the function thereof.

To direct the HDL logic simulator, the circuit designer typically prepares a set of HDL test vectors. The HDL test vectors typically include input test patterns and corresponding output test patterns. The input test patterns may be used to force selected input signals within the behavioral description to predetermined values. The corresponding output test patterns may include the expected simulated values on selected output signals within the behavioral description. It should be noted that both the input and output test patterns typically reference specific signal names within the behavioral description.

The HDL logic simulator may sequentially simulate the functionality of the behavioral description for each input test pattern and provide simulated output values. The simulated output values may be compared with the corresponding output test patterns. Any discrepancy may indicate an error in the behavioral description, which may be corrected by the circuit designer. If an error is found and corrected, the modified behavioral description may be re-simulate to verify that the modified behavioral description correctly implements the desired function.

Once the behavioral description of the integrated circuit has been initially verified, it is transformed into a detailed description (also known as a structural or gate-level description). This conversion process is called synthesis. The detailed description represents the equation-based behavioral description in the form of gate-level objects (components) and the connections (nets) between the objects. The detailed description is used for the remaining design processes.

It is often necessary to verify that the detailed description is correct and that the integrated circuit implements the function expected by the circuit designer and meets predetermined performance goals (e.g. timing). This verification is currently achieved by estimated timing and simulation software tools. This simulation step is similar to the HDL simulation step described above. If errors are found or the resulting functionality is unacceptable, the circuit designer may modify the behavioral description as needed, and the behavioral description may be re-simulated and re-synthesized to produce an updated detailed description.

After timing verifications and functional simulation has been completed on the detailed description, placement and routing of the design's components is performed. These steps involve allocating components of the design to locations on the integrated circuit die and interconnecting the components to form nets. In some cases, it is advantageous to manually place certain critical user-defined blocks or cells within the design. The manual placement of these objects is typically accomplished via a placement tool (e.g. floor-planning tool). Stand alone placement tools are available, but many place and route tools have at least a limited floor-planning or placement capability.

Many user-defined blocks have an outer boundary defined therefor. To increase the predictability of the automatic placement of cells within the circuit design, the auto-placement tool may be set to place all un-placed cells or blocks that are within or below a user-defined block within the outer boundary of the user-defined block. The outer boundary may be appropriately sized to accommodate the placement of all cells or blocks that are within and below the user-defined block in the design hierarchy. In this case, the hierarchy of the detailed description may effect the placement of selected objects within the circuit design.

In some cases, it may be desirable to change the hierarchy of the detailed description such that selected cells or blocks are placed within an outer boundary of a selected user-defined block. Typically, this is accomplished by adding or changing hierarchical statement in the behavioral description. The resulting modified behavioral description may then be re-synthesized to provide the desired hierarchy in the detailed description.

The behavioral description may be changed many times during the design process, and for a variety of reasons. Whenever the behavioral description is changed, at least some of the signal names in the behavioral description may change. This may be problematic, particularly since the HDL test vectors may reference specific signal names within the behavioral description. Thus, the HDL test vectors may have to be updated each time the behavioral description is changed to simulate the modified behavioral description. This can be a tedious and time consuming task.

SUMMARY OF THE INVENTION

The present invention overcomes many of the disadvantages of the prior art by providing a method and apparatus for selectively providing hierarchy to a circuit design. The present invention contemplates providing a number of hierarchical statements in a description of the circuit design, wherein the syntax of the hierarchical statements allows the hierarchical statements to be visible when providing a first representation of the circuit design and effectively invisible when providing a second representation of the circuit design.

In a preferred embodiment, the number of hierarchical statements are provided in a behavioral description of a circuit design. The behavioral description is then provided to both a HDL simulator and a logic synthesis tool. The HDL logic simulator effectively disregard the hierarchical statements, and thus does not provide the hierarchy to the simulation representation of the circuit design. In contrast, the logic synthesis tool interprets the hierarchical statements, and provides the hierarchy to the synthesis representation of the circuit design.

Because the hierarchical statements are effectively disregarded by the HDL logic simulator, any name changes caused by the hierarchical statements may not effect the simulation representation of the circuit design. Thus, the HDL test vectors may not have to be updated when hierarchy is added or changed in the behavioral description. Likewise, because the hierarchical statements are interpreted by the logic synthesizer, the desired hierarchical changes may be provided in the synthesis representation of the circuit design. In the preferred embodiment, the synthesis representation of the circuit design is a detailed description, which is typically used to simulate the design at the gate level, establish the initial physical component placement (floor plan), complete the final physical component placement and net interconnect routing (layout), perform delay calculation and timing analysis, and generate test patterns for manufacturing verification. By using this approach, a number of separate design hierarchies may be provided in two or more circuit representations.

The hierarchical statements may be provided in a predetermined syntax. The syntax may identify those hierarchical statements that are to be selectively included or excluded. In a preferred embodiment, the syntax includes a hierarchical statement surrounded by one or more squiggly brackets. The HDL simulator may recognize this syntax as corresponding to a comment, rather than a behavioral or hierarchical statement, and may thus effectively disregard the statements. In contrast, the logic synthesizer may interpret the hierarchical statements that are in this syntax, and may include the hierarchy represented thereby in the detailed description of the circuit design.

It is also contemplated that the hierarchical statements may be provided in a hierarchical section within the behavioral description of the circuit design. Preferably, the behavioral description is written essentially flat, and the hierarchical statements provided the desired hierarchy to the circuit design. In accordance with a preferred embodiment of the present invention, the hierarchical statements may provide any desired hierarchy by simply defining a hierarchical block, and identifying the components that are to be included therein. The interface of each hierarchical block is automatically generated.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 6B illustrates the addition of the hierarchical level to the circuit design shown in FIG. 6A using a typical behavioral description language;

FIG. 6C illustrates HDL test vector modifications that may be required by the addition of the hierarchical level shown in FIGS. 6A–6B;

DETAILED DESCRIPTION OF THE PREFERRED EMBODIMENTS

Figure 1:
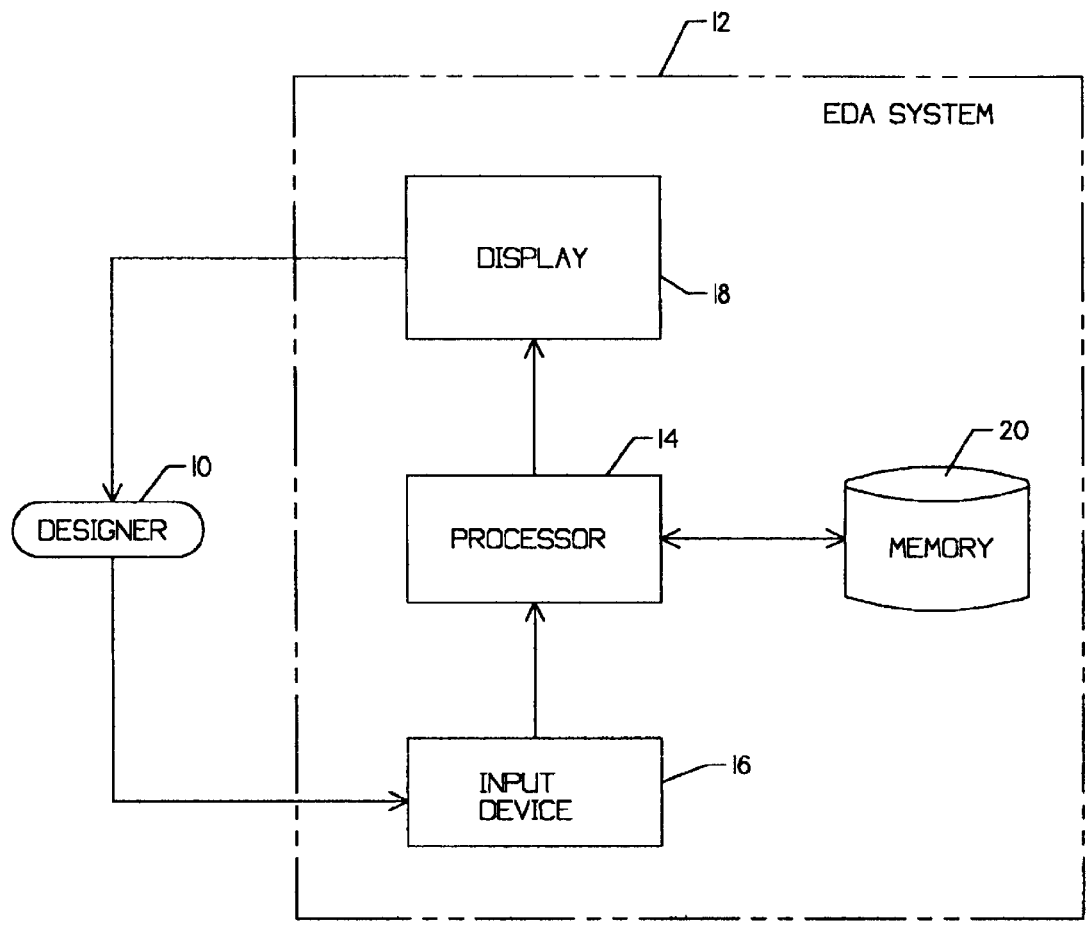
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

FIG. 1 is a block diagram of the computer-based environment of the present invention. A Designer 10 interacts with an Electronic Design Automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 20. The Memory may take the form of a semiconductor memory, magnetic disks, optical disks, magnetic tape or other mass storage device.

Figure 2:
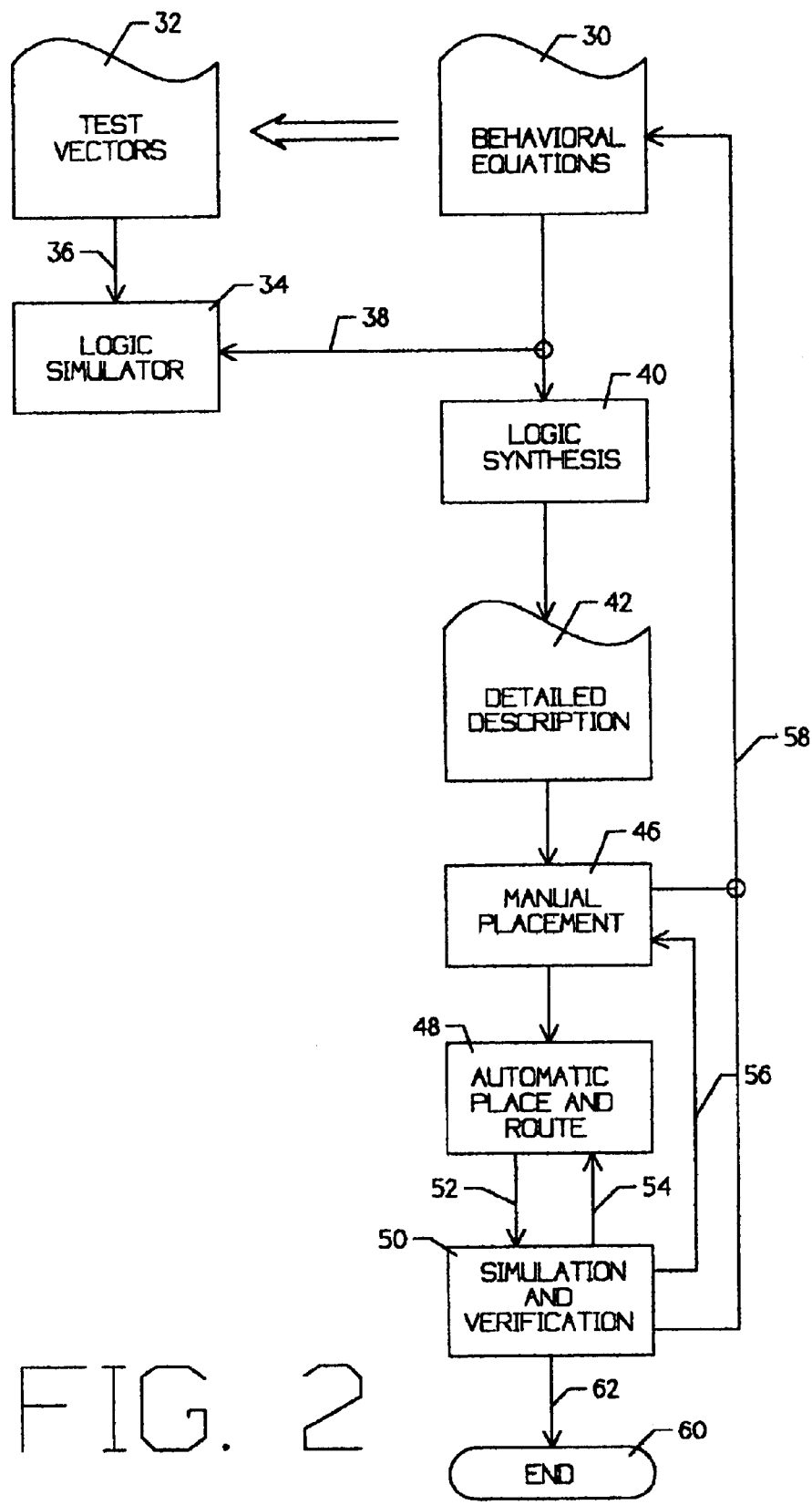
FIG. 2 is a block diagram showing the steps of a typical circuit design process.

FIG. 2 is a block diagram showing the steps of a typical circuit design process. The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system.

More particularly, the design entry operation involves generating a description 30 of the logic design to be implemented on the circuit chip in an appropriate machine-readable form. A common method for specifying the integrated circuit design is the use of hardware description languages (HDL). This method allows a circuit designer to specify the circuit at the register transfer level (also known as a "behavior description"). Using this method, the circuit is defined in small building blocks. The names of the building blocks are specified by the circuit designer. Thus, they usually have logical names with specific functional meaning.

Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

After the behavioral description 30 is entered, the circuit designer typically simulates and verifies that the behavioral description 30 correctly implements the desired function. This is often accomplished using a HDL logic simulator 34. The HDL logic simulator 34 may read the behavioral description 30, or a compiled version thereof, and simulate the function thereof.

To direct the HDL logic simulator, the circuit designer typically prepares a set of HDL test vectors 32. The HDL test vectors 32 typically include input test patterns and corresponding output test patterns. The input test patterns may be used to force selected input signals within the behavioral description 30 to predetermined values. The corresponding output test patterns may include the expected simulated values on selected output signals within the behavioral description 30. It should be noted that both the input and output test patterns typically reference specific signal names within the behavioral description 30.

The HDL logic simulator 34 may sequentially simulate the functionality of the behavioral description 30 for each input test pattern and provide simulated output values. The simulated output values may be compared with the corresponding output test patterns. Any discrepancy may indicate an error in the behavioral description 30, which may be corrected by the circuit designer. If an error is found and corrected, the modified behavioral description may be re-simulate to verify that the modified behavioral description correctly implements the desired function.

Once the behavioral description 30 has been initially verified, it is transformed into a detailed description 42 (also known as a structural or gate-level description). This conversion process is called logic synthesis, as shown at 40. The detailed description 42 represents the equation-based behavioral description 30 in the form of gate-level objects (components) and the connections (nets) between the objects. The detailed description 42 is used for the remaining design processes.

After logic synthesis block 40 provides the detailed description 42, placement and routing of the design's components may be performed. These steps involve allocating components of the design to locations on the integrated circuit die and interconnecting the components to form nets. In some cases, it is advantageous to manually place certain critical user-defined blocks or cells within the design, as shown at 46. The manual placement of these objects is typically accomplished via a placement tool (e.g. floor-planning tool). Stand alone placement tools are available, but many place and route tools have at least a limited floor-planning or placement capability.

After manual placement 46, the remaining un-placed cells and objects may be automatically placed, and the entire design may be routed, as shown at 48. The design is then simulated and verified using known techniques, as shown at 50.

During the manual placement and simulation steps, the circuit designer may wish to modify the circuit design for a variety of reasons. For example, the circuit designer may discover a logic error, which may have to be corrected, in the behavioral description 30, as shown by path 58. Likewise, the circuit designer may determine that an alternative placement may improve the performance of the circuit design. In this case, the circuit designer may return to the manual placement step, as shown by path 56, and modify the placement of selected objects or cells. These steps may be repeated until the circuit design performs the proper function, and meets the desired performance characteristics.

To increase the predictability of the automatic placement step, the auto-placement tool 48 may place all un-placed cells or objects that are within or below a selected user-defined block, within a predefined outer boundary of the selected user-defined block. The outer boundary may be appropriately sized to accommodate the placement of all cells or blocks that are within and below the user-defined block in the design hierarchy. For these automatic placement tools, the hierarchy of the detailed description 42 may effect the placement of selected objects within the circuit design.

In some cases, it may be desirable to change the hierarchy of the detailed description 42 such that selected cells or blocks are placed within an outer boundary of a selected user-defined block. Typically, this is accomplished by adding or changing hierarchical statement in the behavioral description 30, as shown by path 58. The modified behavioral description may then be re-synthesized, as shown at 40, to provide the desired hierarchy in the detailed description 42.

As indicated above, the behavioral description 30 may be changed many times during the design process, and for a variety of reasons. Whenever the behavioral description is changed, at least some of the signal names in the behavioral description 30 may also change. This may be problematic, particularly since many HDL test vectors 32 reference specific signal names within the behavioral description 30. Thus, the HDL test vectors 32 may have to be updated each time the behavioral description 30 is changed. Modifying the HDL test vectors 32 in this manner may be a tedious and time consuming task.

Figure 3:
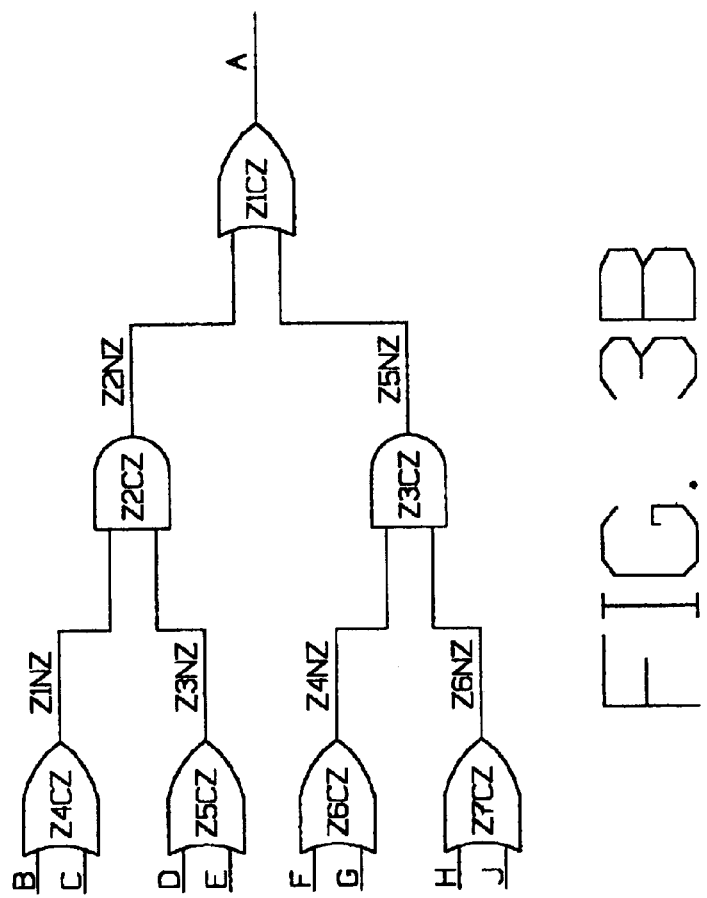
FIG. 3A illustrates a behavioral equation representation of selected logic from a circuit design.
FIG. 3B is a detailed level description synthesized from the behavioral equation shown in FIG. 3A.

FIG. 3A illustrates a typical logic synthesis step, and shows the transformation of a simple behavioral description to a corresponding detailed description. In this simple example, the signal named "A" is generated by a combination of "AND" and "OR" logical functions. The input signals are provided by "B", "C", "D", "E", "F", "G", "H", and "J". This behavior description is then input to a logic design synthesis tool to produce a gate-level (or detailed) description.

FIG. 3B is a gate-level representation synthesized from the behavior description shown in FIG. 3A. The user-defined names "A", "B", "C", "D", "E", "F", "G", "H", and "J" are shown as input and output lines for the circuit. The logic design synthesis tool has generated multiple "AND" and "OR" gates to implement the behavioral description. These gates, and the interconnections between them, are typically given names by the logic design synthesis tool. In the example shown in FIG. 3B, all synthesis-generated names start with the letter "Z".

Figure 4:
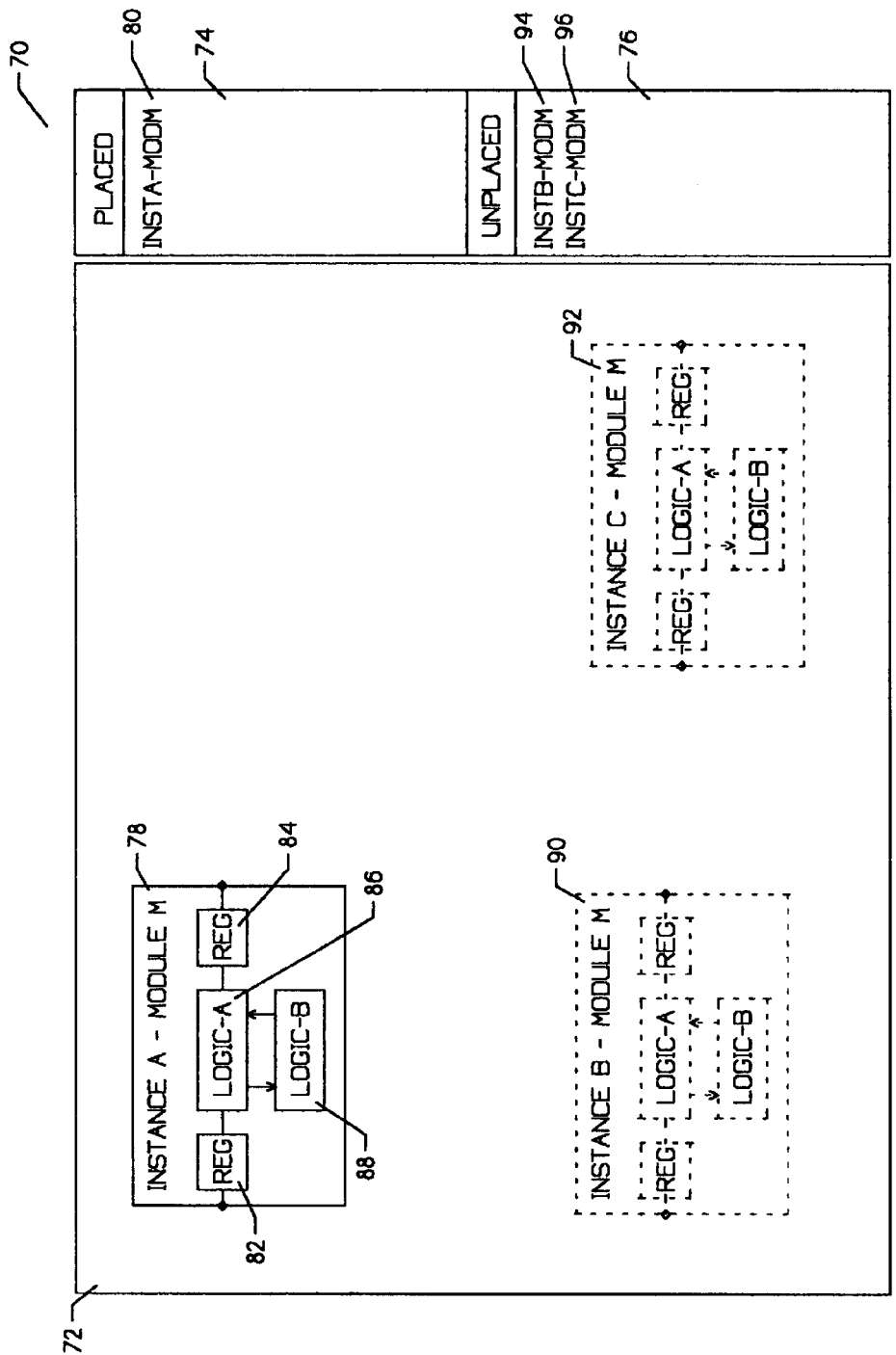
FIG. 4 illustrates the multiple placement of a hierarchical module using a placement tool.

FIG. 4 illustrates that manual placement may be made more efficient by including hierarchy in the circuit design. The display of a placement tool is generally shown at 70, and includes a floorplanning window 72, a window that displays the placed cells 74, and a window that displays the un-placed cells 76.

A number of instances are shown including instance "A" 78, instance "B" 90 and instance "C" 92. Each of the instances 78, 90 and 92 are a separate placement of a Module-M. Referring to instance "All " 78, Module-M includes a first register 82, a second register 84, a first logic block logic-A 86 and a second logic block logic-B 88. The circuit designer may place the first register 82, the second register 84, the first logic block logic-A 86 and the second logic block logic-B 88 at desired locations within Module-M. Thereafter, the remaining Module-M instances, including instances "B" 90 and instance "C" 92, may be placed as shown by dotted lines. The underlying objects of instance "B" 90 and instance "C" 92 may assume the same relative placement position as in instance "A" 78. As can readily be seen, this may eliminate the need to place the underlying objects within instance "B" 90 and instance "C" 92.

Figure 5:
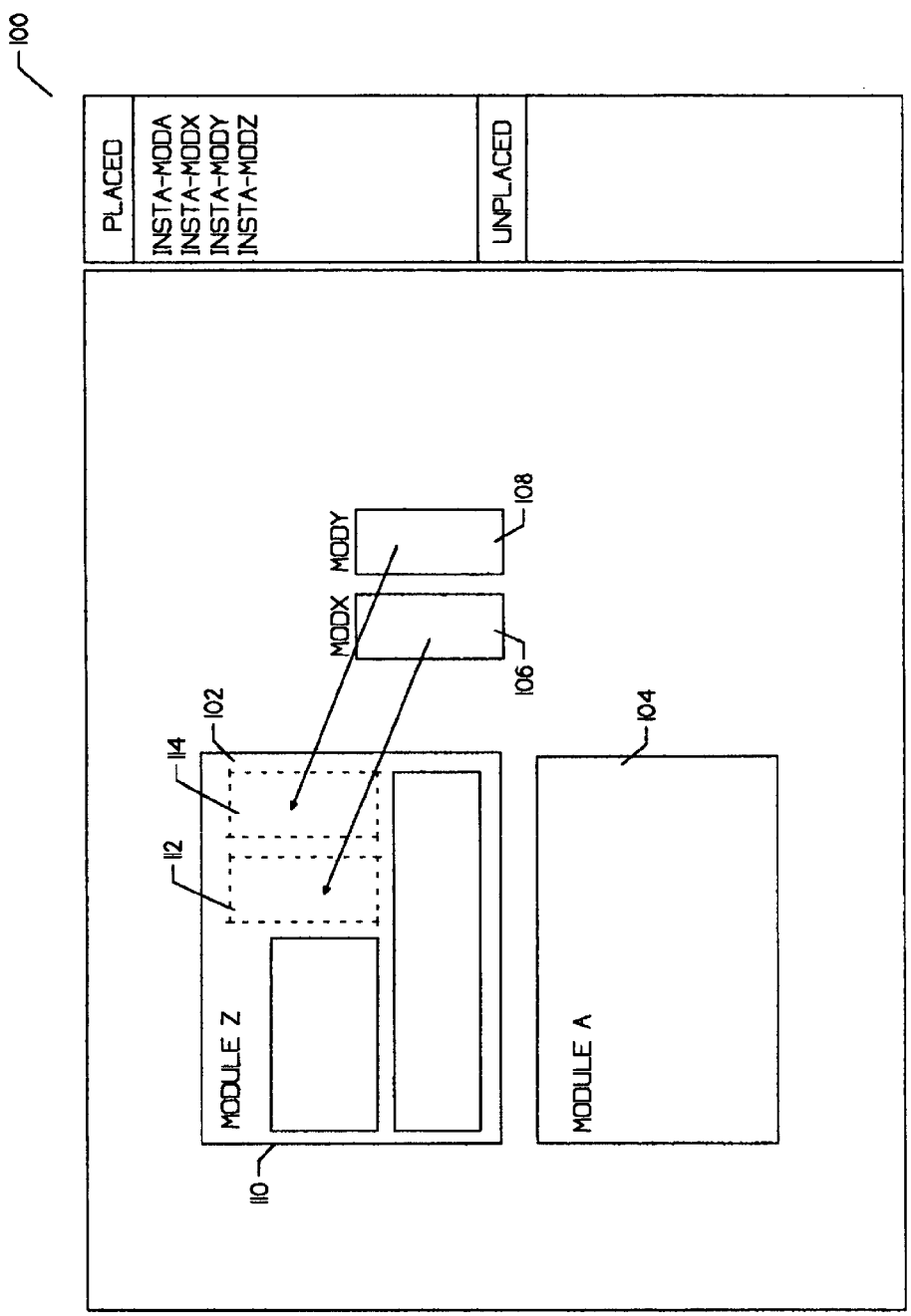
FIG. 5 illustrates a potential hierarchical change to accomplish a desired placement of the circuit design.

FIG. 5 illustrates that the hierarchy defined for the detailed description may influence the placement of the circuit design. As indicated above, some automatic placement tools may be set to place all un-placed cells or objects that are hierarchically within or below a selected user-defined block, within a predefined outer boundary of the selected user-defined block. This may increase the predictability of the automatic placement of the circuit design. In this environment, the circuit designer may place selected hierarchical regions, and may rely on the automatic placement tool to place the underlying objects within the outer boundary thereof. The placement of the underlying objects may be constrained to locations that are within the outer boundary of the placed hierarchical regions.

It is contemplated that the outer boundary of the hierarchical regions may be appropriately sized to accommodate the placement of all cells or blocks that are hierarchically within or below the corresponding hierarchical region. As can readily be seen, the hierarchy that is defined in the detailed description may effect the placement of selected objects within the circuit design.

In the example shown in FIG. 5, module "Z" 102, module "A" 104, module "X" 106 and module "Y" are already placed. Each module includes an outer boundary, including outer boundary 110 of Module "Z" 102. During manual placement (or any step thereafter), the circuit designer may wish to place module "X" 106 and module "Y" 108 within the outer boundary 110 of module "Z" 102. This may be desirable to provide a more efficient overall placement, increased performance, etc.

To accomplish this, is may be necessary to change the hierarchy in the detailed description (see above) such that module "X" 106 and module "Y" 108 are hierarchically within module "Z" 102. Thereafter, the automatic placement tool may place module "X" 106 and module "Y" 108 within outer boundary 110 of module "Z" 102. The hierarchy of the detailed description is typically changed by adding or changing hierarchical statement in the behavioral description, and then re-synthesizing the behavioral description to provide a modified detailed description with the desired hierarchy.

It is contemplated that the behavioral description may be changed many times during the design process, and for a variety of reasons. Whenever the behavioral description is changed, at least some of the signal names in the behavioral description may also change. This may be problematic, particularly since many HDL test vectors reference specific signal names within the behavioral description. Thus, the HDL test vectors may have to be updated each time the behavioral description is changed to simulate the modified behavioral description. Modifying the HDL test vectors to reflect such changes may be a tedious and time consuming task.

Figure 6A:
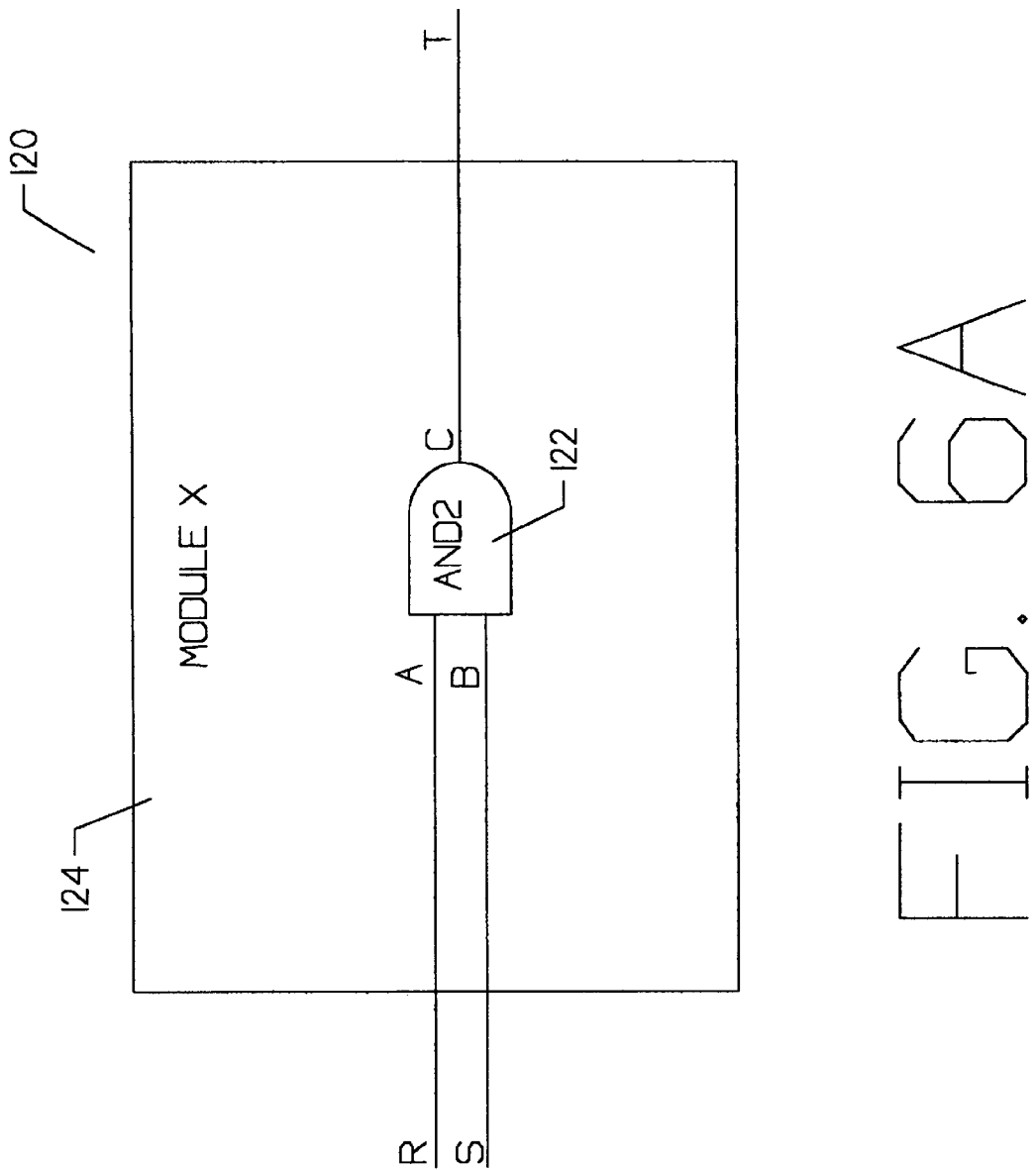
FIG. 6A is a schematic diagram showing the addition of a hierarchical level.

FIG. 6A is a schematic diagram showing the addition of a hierarchical level to a circuit design. The diagram is generally shown at 120, and include an AND gate 122. The AND gate 122 is driven by inputs signals "A" and "B", and provides an output signal "C", as shown. The AND gate 122 is provided within a hierarchical module "X" 124.

FIG. 6B shows typical behavioral descriptions for module "X" 124. A first behavioral description is shown at 130 and a second behavioral representation is shown at 140. The first behavioral description 130 includes a number of hierarchical statements that are in a VHDL (VHSIC Hardware Description Language) format. In VHDL, a predefined hierarchy may be provided to a behavioral description by using a BLOCK statement. For example, the first line of the first behavioral description 130 indicates a block name and a block identifier. Thereafter, interface ports are defined for module "X", as shown at 132. A port map is then provided which maps the interface port names to the signal names used internal to the module, or in this case, the signal names of the AND gates. For example, interface port "R" corresponds to the input signal "A" of the functional statement C=A * B, as shown at 136.

Similarly, the second behavioral description 140 includes a number of hierarchical statements that are in a VHDL (VHSIC Hardware Description Language) format. In this example, the AND2 gate 122 is instantiated within module "X" 124. Like above, the first line of the second behavioral description 140 indicates a block name and a block identifier. Thereafter, the interface ports are defined for module "X", as shown at 142. An component instantiation statement 144 is then provided, which instantiates the component AND2. The component instantiation statement 144 includes a port map, as shown at 146, which maps the ports o of the AND2 component to the interface port names of module "X". As can be seen from the above example, the addition of a level of hierarchy to the behavioral description may change selected signal names within the behavioral description.

FIG. 6C illustrates HDL test vector modifications that may be required with the addition of the hierarchical level shown in FIGS. 6A–6B. Illustrative HDL test vectors for the component AND2 are shown at 150. The HDL test vectors reference specific signal names within the behavioral description. For example, the behavioral description for the AND2 component may be represented as "C=A * B". Thus, the test vectors typically reference signal names "A", "B" and "C". For example, the first line of the HDL test vectors shown at 150 is "A←0;". An HDL simulator may read this statement and assign a value of "0" to the signal named "A". Similarly, the second line of the HDL test vectors shown at 150 is "B←0;". The HDL simulator may read this statement and assign a value of "0" to the signal names "B". Finally, the third line of the RDL test vectors shown at 150 checks the simulated value on output signal "C", and provides an error if it is equal to "1".

If a level of hierarchy is added to the behavioral description, as shown in FIGS. 6A–6B, the input and output signal names may change from "A", "B", and "C" to "R", "S" and "T", respectively. Thus, the HDL test vectors may have to be modified to reflect these new signal names. The modified HDL test vectors are generally shown at 152. Note that the circuit designer may have to edit the original HDL test vector shown at 150, to reference the new signal names of module "X" 124. This may be a tedious and time consuming task, particularly for large complex circuit designs.

Figure 7:
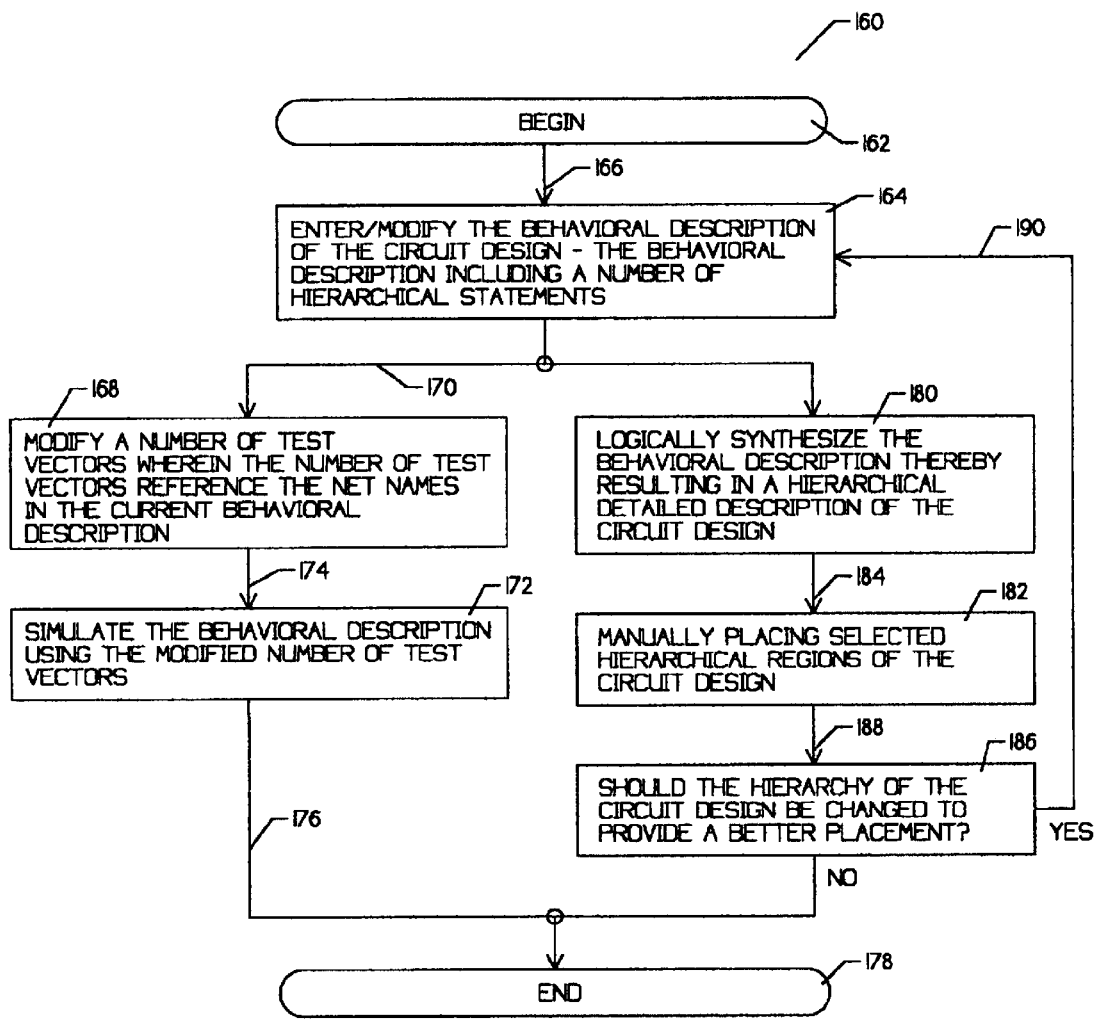
FIG. 7 is a flow diagram showing a typical prior art design process, wherein the HDL test vectors must be updated each time the hierarchy is changed in the behavioral description.

FIG. 7 is a flow diagram showing a typical prior art design process, wherein the HDL test vectors must be updated each time the hierarchy is changed in the behavioral description. The algorithm is generally shown at 160, and is entered at element 162. Control is passed to element 164 via path 166. Element 164 enables a circuit designer to enter or modify a behavioral description of a circuit design. The behavioral description may include a number of hierarchical statements. Control is then passed to element 168 via path 170. Element 168 modifies a number of test vectors, wherein the number of test vectors reference selected net names within the current behavioral description. Control is then passed to element 172 via path 174. Element 172 simulates the current behavioral description using the modified number of HDL test vectors. Control is then passed to element 178 via path 176, wherein the algorithm may be exited.

Referring back to element 164, after the behavioral description of the circuit design has been entered or modified, control is passed to element 180 via path 170. Element 180 logically synthesizes the behavioral description. Since the behavioral description includes a number of hierarchical statements, the logical synthesizing element 180 may provide a detailed description of the circuit design that incorporates the corresponding hierarchy. Control is then passed to element 182 via path 184. Element 182 manually places selected hierarchical regions of the circuit design. Control is then passed to element 186 via path 188. Element 186 determines whether the hierarchy of the circuit design should be changed to provide a better placement. If the hierarchy of the circuit design should be changed to provide a better placement, control is passed back to element 164 via path 190. Element 164 may allow a circuit designer to modify the behavioral description of the circuit design to provide an updated behavioral description. The updated behavioral description may include new or different hierarchical statements therein. It is contemplated that the updated behavioral description may be provided to both blocks 168 and 180 via path 170, as described above. Referring back to element 186, if the hierarchy of the circuit design does not need to be changed to provide a better placement, control is passed to element 178 via path 176, wherein the algorithm is exited.

Figure 8:
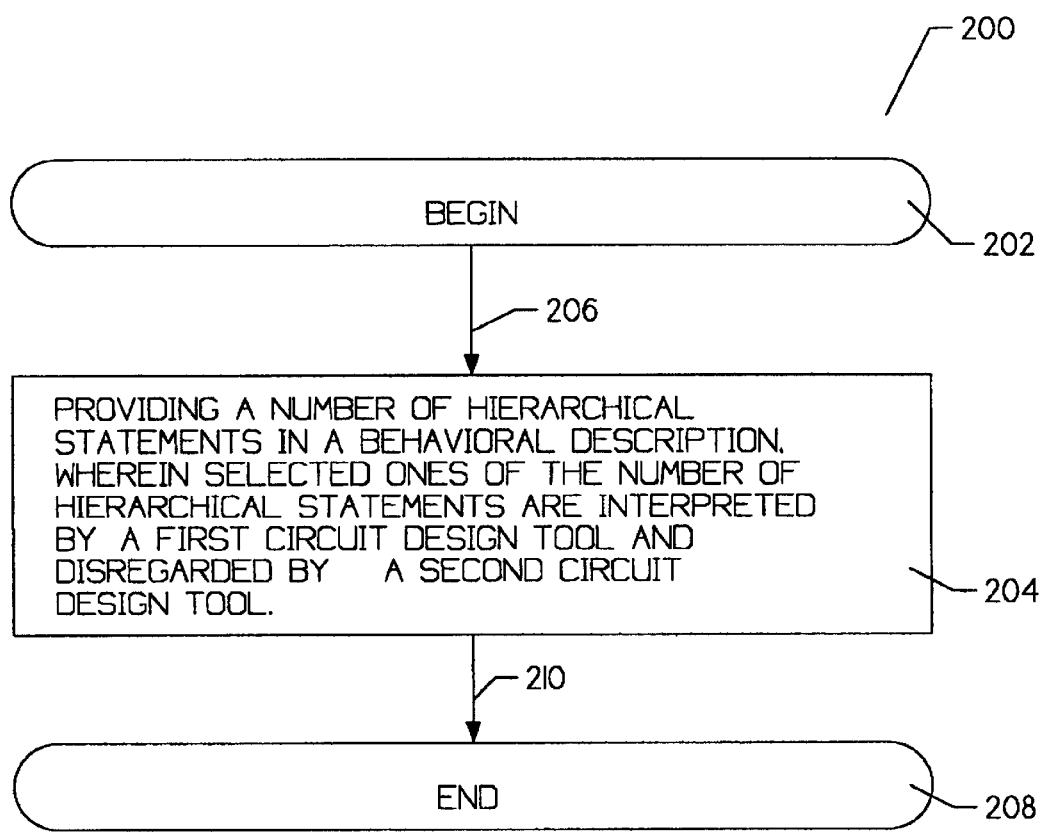
FIG. 8 is a flow diagram showing a first illustrative method of the present invention.

FIG. 8 is a flow diagram showing a first illustrative method of the present invention. The algorithm is generally shown at 200, and is entered at element 202. Control is passed to element 204 via path 206. Element 204 provides a number of hierarchical statements in a behavioral description, wherein selected ones of the number of hierarchical statements are interpreted by a first circuit design tool and disregarded by a second circuit design tool. Control is then passed to element 208 via path 210, wherein the algorithm is exited.

Figure 9A:
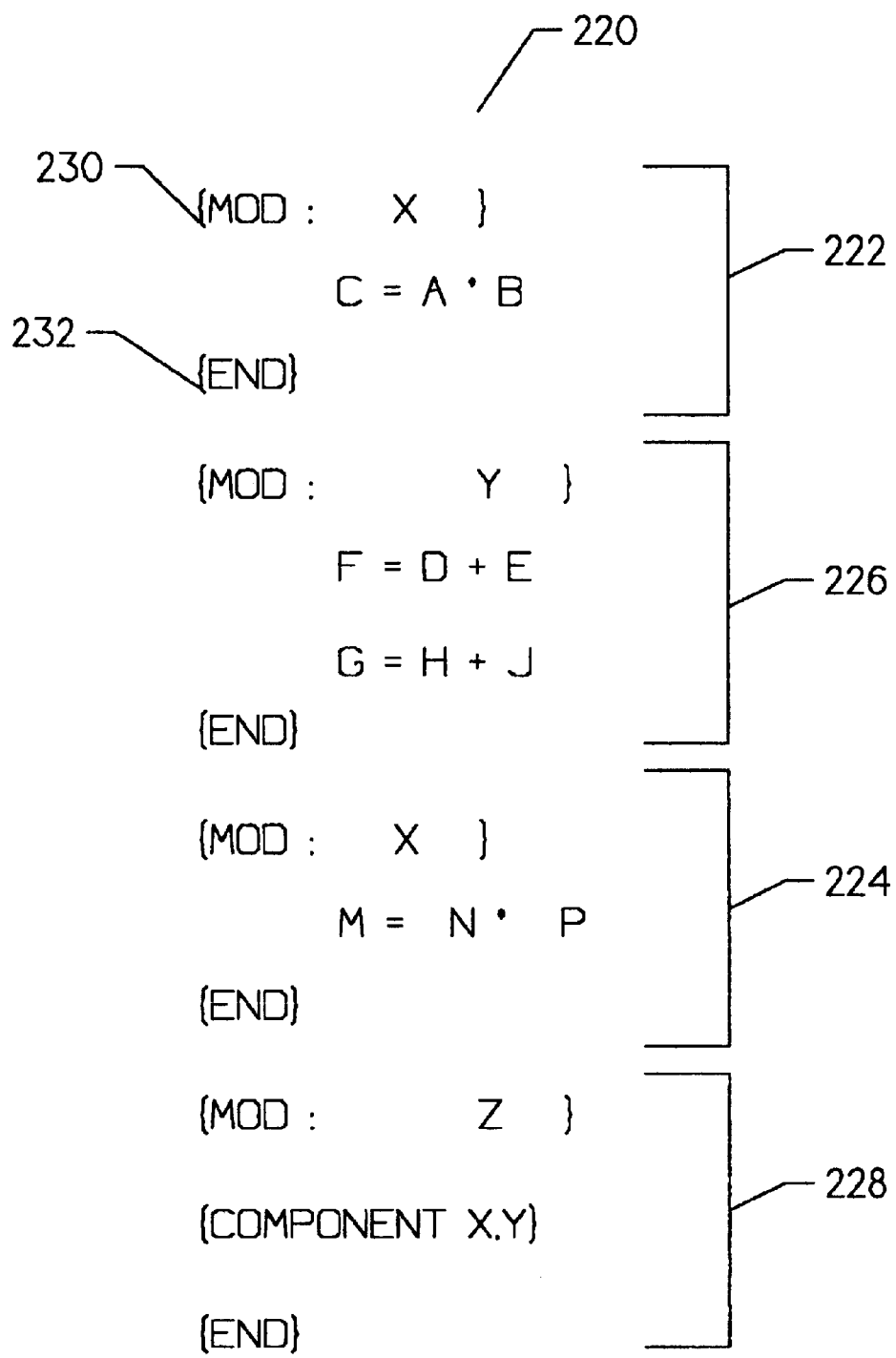
FIG. 9A illustrates the insertion of selected hierarchical statements into a behavioral description, in accordance with the present invention.

FIG. 9A illustrates the insertion of selected hierarchical statements into a behavioral description, in accordance with the present invention. The behavioral description is generally shown at 220, and includes a number of hierarchical statements therein. In a preferred embodiment, the behavioral description is written in the UDSL format. A further description of the UDSL format is available from the assignee of the present invention.

The present invention contemplates providing a number of hierarchical statements within a behavioral description to create the desired hierarchy. For example, a module "X" is defined by the statements shown at 222 and 224. A first hierarchical statement begins the module definition and specifies a module name, for example module "X", as shown at 230. Likewise, a second hierarchical statement indicates the end of the module definition, as shown at 232. In most cases, there is a number of behavioral equations between the first and second hierarchical statements, which define the logic within the corresponding module (see FIG. 9B).

Note that in the illustrative embodiment, selected behavioral equations may be added to a previously defined module by simply referencing the previous module name in the first hierarchical statement. In the example shown in FIG. 9A, the behavioral equation "M=N * P" may be added to module "X" by providing hierarchical statements that reference the module name "X". In this way, a circuit designer can define a module using non-sequential behavioral equations, and thus need not modify the order of the behavioral equations in the behavioral description.

The hierarchical statements may be provided in a predetermined syntax. The syntax may identify those hierarchical statements that are to be selectively included or excluded in a circuit design representation. In the illustrative embodiment, the syntax includes a hierarchical statement surrounded by one or more squiggly brackets, as shown. It is contemplated, however, that any syntax that identifies selected hierarchical statements may be used. An HDL simulator may recognize the selected syntax as corresponding to a comment, rather than a behavioral or hierarchical statement, and may thus effectively disregard the statements therein. In a preferred embodiment, the HDL simulator may treat anything included within squiggly brackets as a comment, and thus effectively disregarded the statements therein.

In contrast, the logic synthesizer may interpret statements in this syntax in the same way as any other statement. Thus, the hierarchy defined therein may be included in the resulting detailed description. In a preferred embodiment, the logic synthesizer is the BEST synthesizer, which is available from the assignee of the present invention. The BEST synthesizer interprets the hierarchical statements that are provided in squiggly brackets, and provides the hierarchy indicated therein into the resulting detailed description.

Because the hierarchical statements are effectively disregarded by the HDL logic simulator, any name changes caused by the hierarchical statements may not effect the simulated representation of the circuit design. Thus, the HDL test vectors may not have to be updated when hierarchy is added or changed in the behavioral description. Likewise, because the hierarchical statements are interpreted by the logic synthesizer, the desired hierarchical changes may be provided in the synthesized representation of the circuit design. The synthesized representation of the circuit design, or detailed description, may then be used to simulate the design at the gate level, establish the initial physical component placement (floor plan), complete the final physical component placement and net interconnect routing (layout), perform delay calculation and timing analysis, and generate test patterns for manufacturing verification. By using the above approach, a number of separate design hierarchies may be provided in two or more circuit representations.

In a preferred embodiment, the initial behavioral description is written flat, with no hierarchy defined therefor. Because the initial behavioral description is written flat, all of the signal names are uniquely defined. Thus, the hierarchical statements provided in the behavioral description may not have to define a port map or an interface definition, as generally required by other high level description languages such as VHDL. Thus, the insertion and modification of the hierarchy statements in the behavioral description may be easier and less time consuming.

As can readily be seen, the present invention contemplates providing a number of hierarchical statements in a description of the circuit design, wherein the syntax of the hierarchical statements allows the hierarchical statements to be visible when providing a first representation of the circuit design and effectively invisible when providing a second representation of the circuit design.

Figure 9B:
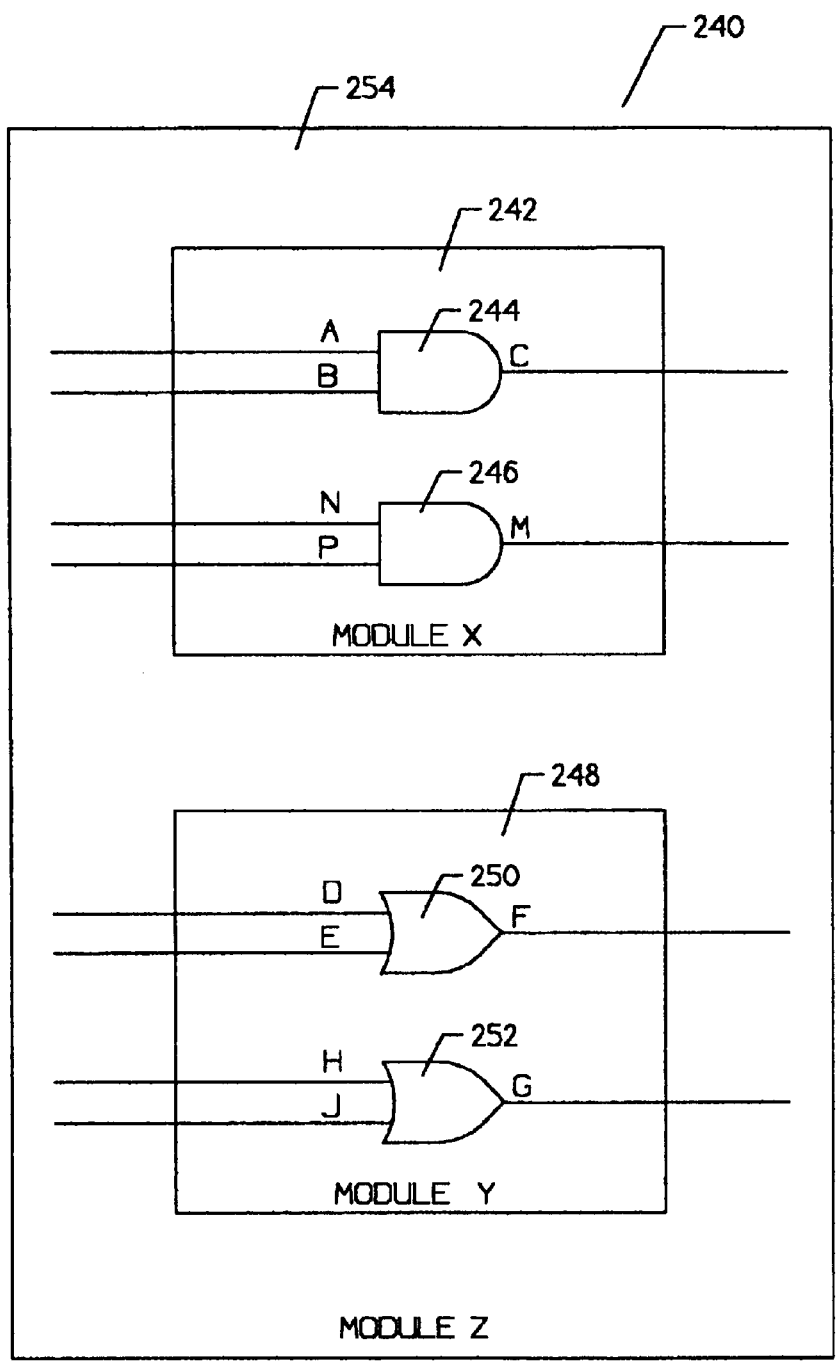
FIG. 9B is a block diagram showing the detailed description that may result by synthesizing the behavioral description shown in FIG. 9A.

FIG. 9B is a block diagram showing the detailed description 240 that may result by synthesizing the behavioral description shown in FIG. 9A. As discussed above, the behavioral description shown in FIG. 9A include a number of hierarchical statements. The hierarchical statements defined a module "X", which includes the behavioral equations "C=A * B" and "M=N * P", as shown at 222 and 224. After the logic synthesis step, the resulting detailed description may include module "X" 242, wherein module "X" 242 includes AND gate 244 and AND gate 246, as shown.

Similarly, the hierarchical statements shown in FIG. 9A define a module "Y", which includes the behavioral equations "F=D+E" and "G=H+J", as shown at 226. After the logic synthesis step, the resulting detailed description may include module "Y" 248, wherein module "Y" 248 includes OR gate 250 and AND gate 252, as shown.

Finally, the hierarchical statements shown in FIG. 9A define a module "Z", which includes an instantiation of modules "X" and "Y", as shown at 228. After the logic synthesis step, the resulting detailed description may include module "Z" 254, wherein module "Z" 254 includes an instantiation of modules "X" and "Y", as shown at 242 and 248.

In contrast to the above, the HDL simulator may effectively disregard the hierarchical statements shown in FIG. 9A, and in a preferred embodiment, may simulate an effectively flat behavioral description.

Figure 10A:
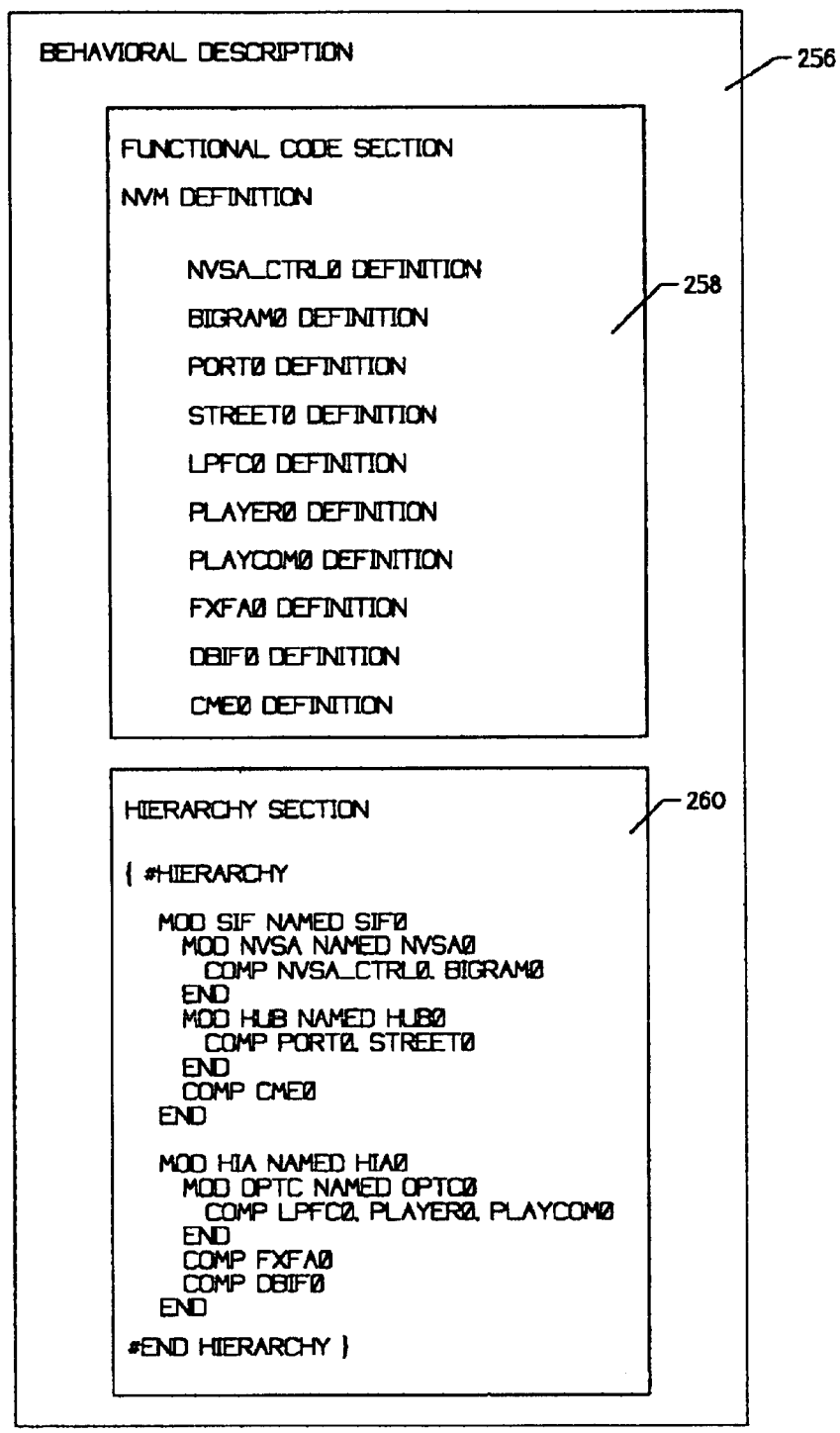
FIG. 10A shows an illustrative hierarchical section that is incorporated into an essentially flat behavioral description to provide hierarchy thereto.

FIG. 10A shows an illustrative hierarchical section that is incorporated into an essentially flat behavioral description to provide hierarchy thereto. The behavioral description is generally shown at 256, and includes a functional code section 258 and a hierarchical section 260. Preferably, the hierarchical section is positioned at the end of the behavioral description 256 as shown, but it is recognized that it may be included anywhere within the behavioral description 256.

The functional code section 258 defines a top level module NVM. Included in the definition of the top level module NVM are the functional definitions for a number of lower level modules, including lower-level modules NVSA_CTRL0, BIGRAM0, PORT0, STREET0, LPFC0, PLAYER0, PLAYCOM0, FXFA0, DBIF0 and CME0. In the illustrative diagram, the indentation of each of the lower level module definitions relative to the top level module NVM indicates that the lower level modules are included in the top level module NVM.

In a preferred embodiment, a desired hierarchy may be provided to the behavioral description 256 by providing a hierarchical section 260. The hierarchical section 260 includes a number of hierarchical statements. The hierarchical statements may provide any desired hierarchy to the behavioral description by simply defining a hierarchical module, and identifying the components that are to be included therein.

In the illustrative example, an SIF module is provided. The SIF module includes the components identified between the "MOD SIF NAMED SIF0" statement and the corresponding END statement. It is contemplated that additional levels of hierarchy may be provided by simply including a lower module definition within a higher level module definition. This is illustrated by the inclusion of the "MOD NVSA NAMED NVSA0" and "MOD HUB NAMED HUB0" statements within the "MOD SIF NAMED SIF0" statement.

Figure 10B:
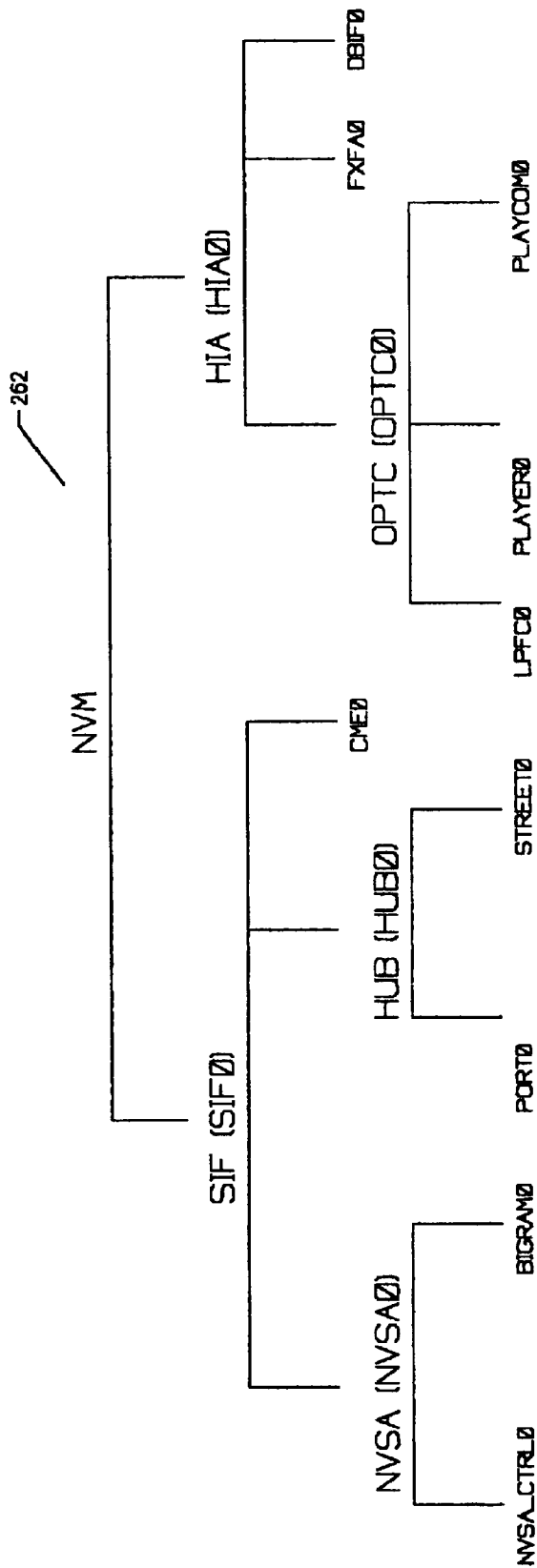
FIG. 10B shows a tree graph of the resulting hierarchy provided by the hierarchical section of FIG. 10A.

FIG. 10B shows a tree graph of the resulting hierarchy provided by the hierarchical section of FIG. 10A. The tree graph is generally shown at 262. The NVM module includes two lower level modules SIF and HIA. The SIF module includes two sub-modules and a component. The sub-modules are modules NVSA and HUB, and the component is CME0. The NVSA sub-module includes two components, including components NVSA_CTRL0 and BIGRAM0. Likewise the HUB sub-module has two components, including components PORT0 and STREET0.

The lower level module HIA includes one sub-module and two components. The sub-module is the OPTC sub-module, and the components are the FXFA0 and DBIF0 components. The OPTC sub-module includes the components LPFC0, PLAYER0 and PLAYCOM0.

As can readily be seen by the above example, a desired hierarchy may be provided to a behavioral description by simply providing a number of hierarchical statements within a behavioral description. The hierarchical statements may be interpreted by a circuit design tool, for example a logic synthesizer, thereby providing the corresponding hierarchy to the behavioral description. Thus, the present invention provides a simply way to provide hierarchy to a behavioral description of a circuit design. Further, the hierarchy may be easily modified, by simply changing the statements in the hierarchical section of the behavioral description. In a preferred embodiment, the interface of each hierarchical module that is defined in the hierarchical section, and the interconnect between modules, may be automatically generated.

Figure 11:
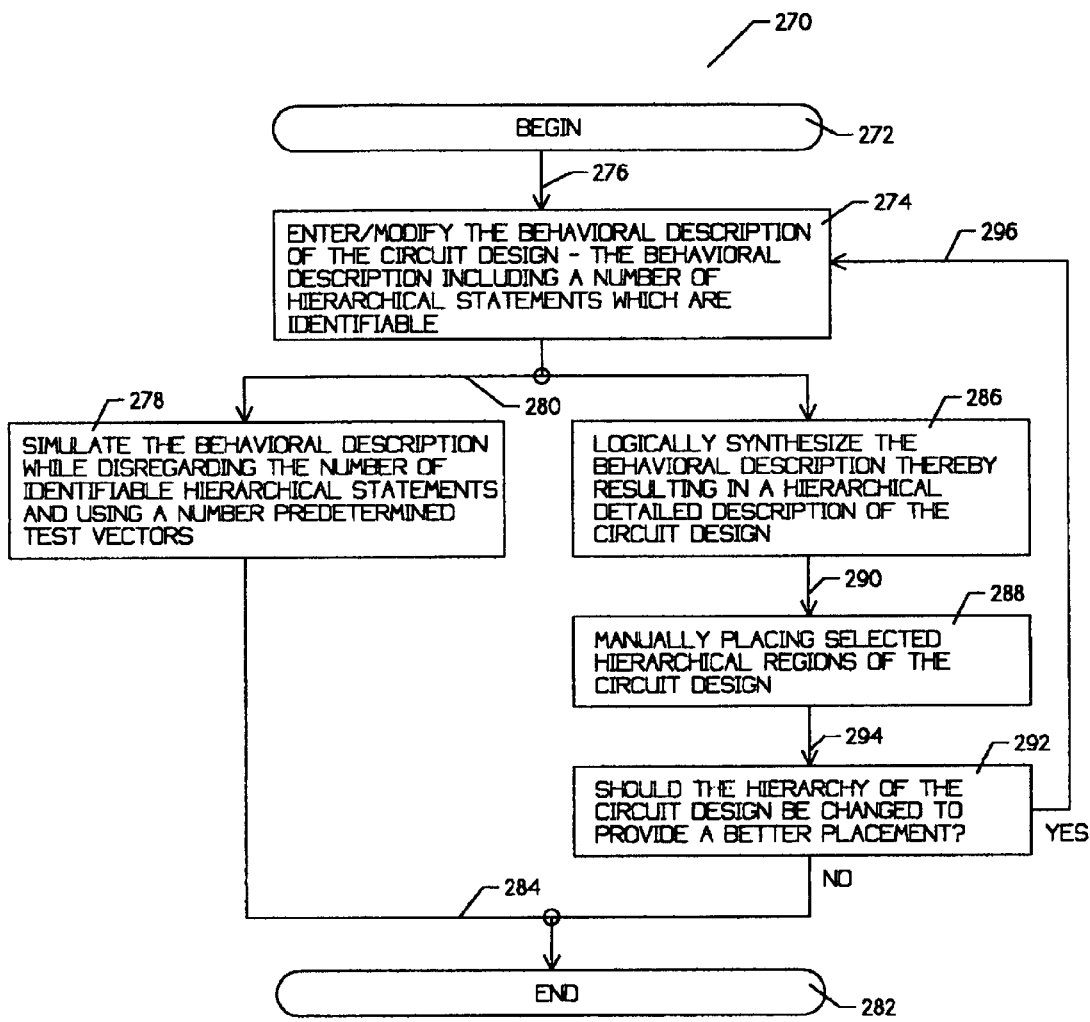
FIG. 11 is a flow diagram showing a second illustrative method of the present invention.

FIG. 11 is a flow diagram showing a second illustrative method of the present invention. The algorithm is generally shown at 270, and is entered at element 272. Control is passed to element 274 via path 276. Element 274 allows a circuit designer to enter or modify the behavioral description of a circuit design, wherein the behavioral description includes a number of hierarchical statements which are identifiable. Control is then passed to element 278 and element 286 via path 280. Element 278 simulates the behavioral description, but disregards the number of the identifiable hierarchical statements. Element 278 uses a number of predetermined test vectors to control the simulation of the behavioral description. Control is passed to element 282 via path 284, wherein the algorithm may be exited.

Referring back to element 286, element 286 logically synthesizes the behavioral description, thereby resulting in a hierarchical detailed description of the circuit design. Control is passed to element 288 via path 290. Element 288 manually places selected hierarchy regions of the circuit design. Control is passed to element 292 via path 294. Element 292 determines whether the hierarchy of the circuit design should be changed to provide a better placement. If it is determined that the hierarchical of the circuit design should be changed to provide a better placement, control is passed back to element 274 via path 296, wherein the behavioral description may be modified. If it is determined that the hierarchy of the circuit design need not be changed, control is passed to element 282 via path 284, wherein the algorithm is exited.

It is contemplated that the output of element 278 may be provided to the input of element 286. Thus, the simulating step 278 may be done prior to logically synthesizing the behavioral description at element 286.

Figure 12:
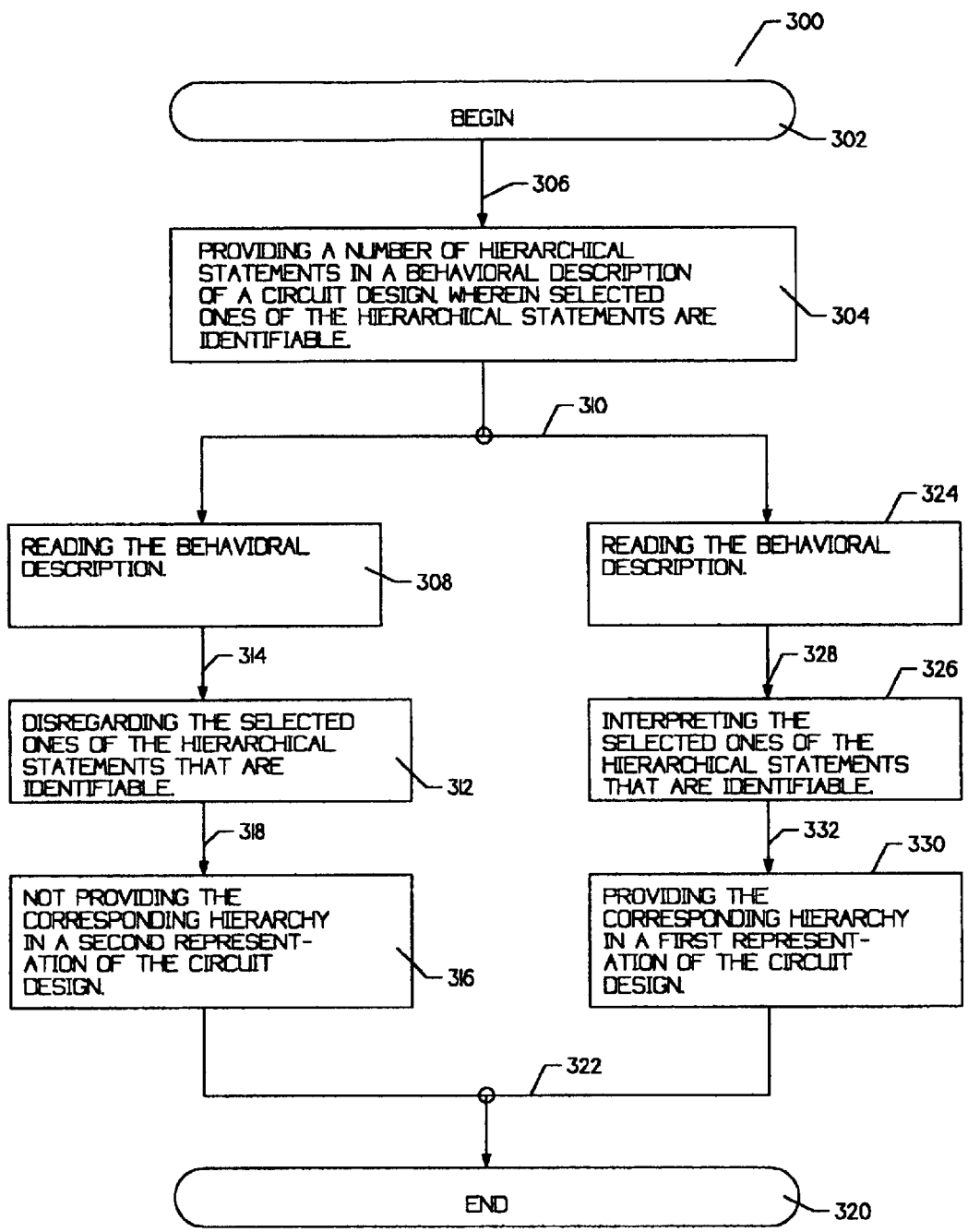
FIG. 12 is a flow diagram showing a third illustrative method of the present invention.

FIG. 12 is a flow diagram showing a third illustrative method of the present invention. The algorithm is generally shown at 300, and is entered at element 302. Control is passed to element 304 via path 306. Element 304 provides a number of hierarchical statements in a behavioral description of a circuit design, wherein selected ones of the hierarchical statements are identifiable. Control is then passed to elements 308 and 324. Element 308 reads the behavioral description. Control is passed to element 312 via path 314. Element 312 disregards the selected ones of the hierarchical statements that are identifiable. Control is passed to element 316 via path 318. Element 316 provides a second representation of the circuit design, wherein the second representation does not include the corresponding hierarchy. Control is passed to element 320 via path 322, wherein the algorithm is exited.

Referring back to element 324, element 324 reads the behavioral description. Control is passed to element 326 via path 328. Element 326 interprets the selected ones of the hierarchical statements that are identifiable. Control is then passed to element 330 via path 332. Element 330 provides the corresponding hierarchy in a first representation of the circuit design. Control is then passed to element 320 via path 322, wherein the algorithm is exited.

Figure 13:
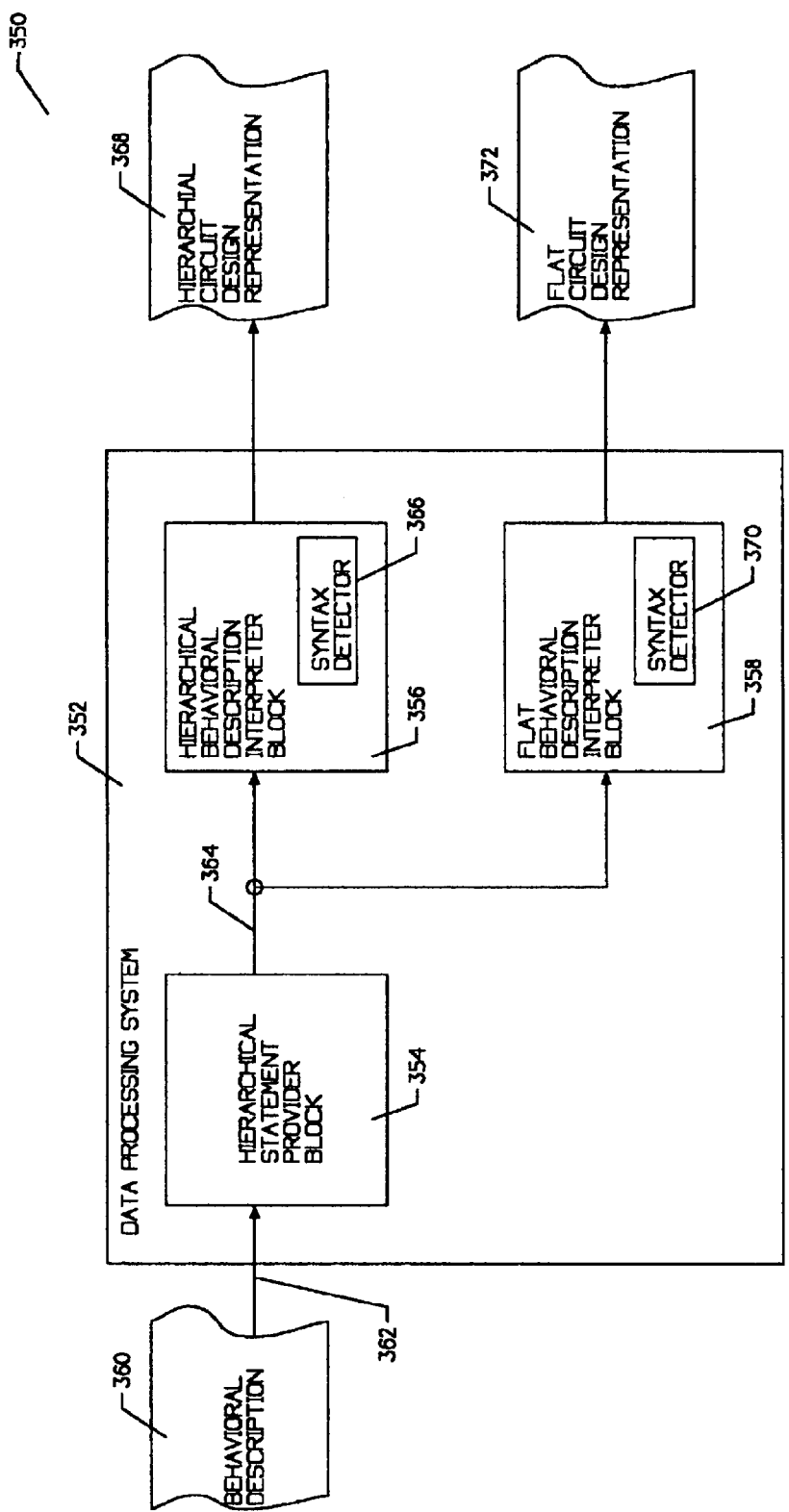
FIG. 13 is a block diagram showing an illustrative data processing system in accordance with the present invention.

FIG. 13 is a block diagram showing an illustrative data processing system 352 in accordance with the present invention. The data processing system includes a hierarchical statement provider block 354, a hierarchial behavioral description interpreter block 356 and a flat behavioral description interpreter block 358. The hierarchical statement provider block 354 reads a behavioral description 360 via interface 362, and provides a number of hierarchical statements therein. The hierarchical statements are provided such that they are identifiable, and preferably with an identifiable syntax. The hierarchical behavioral description interpreter block 356 interprets the hierarchical statements and provides a circuit design representation 368 which includes the corresponding hierarchy. Preferably, the hierarchical behavioral description interpreter block 356 includes a syntax detector 366 which may identify the hierarchical statements provided by the hierarchical statement provider block 354.

The flat behavioral description interpreter block 358 effectively disregards the hierarchical statements, and provides a circuit design representation 372 that does not include the corresponding hierarchy. In some cases, this may result in a flat circuit design representation. Preferably, the flat behavioral description interpreter block 358 includes a syntax detector 370 which may identify the hierarchical statements provided by the hierarchical statement provider block 354.

Figure 14:
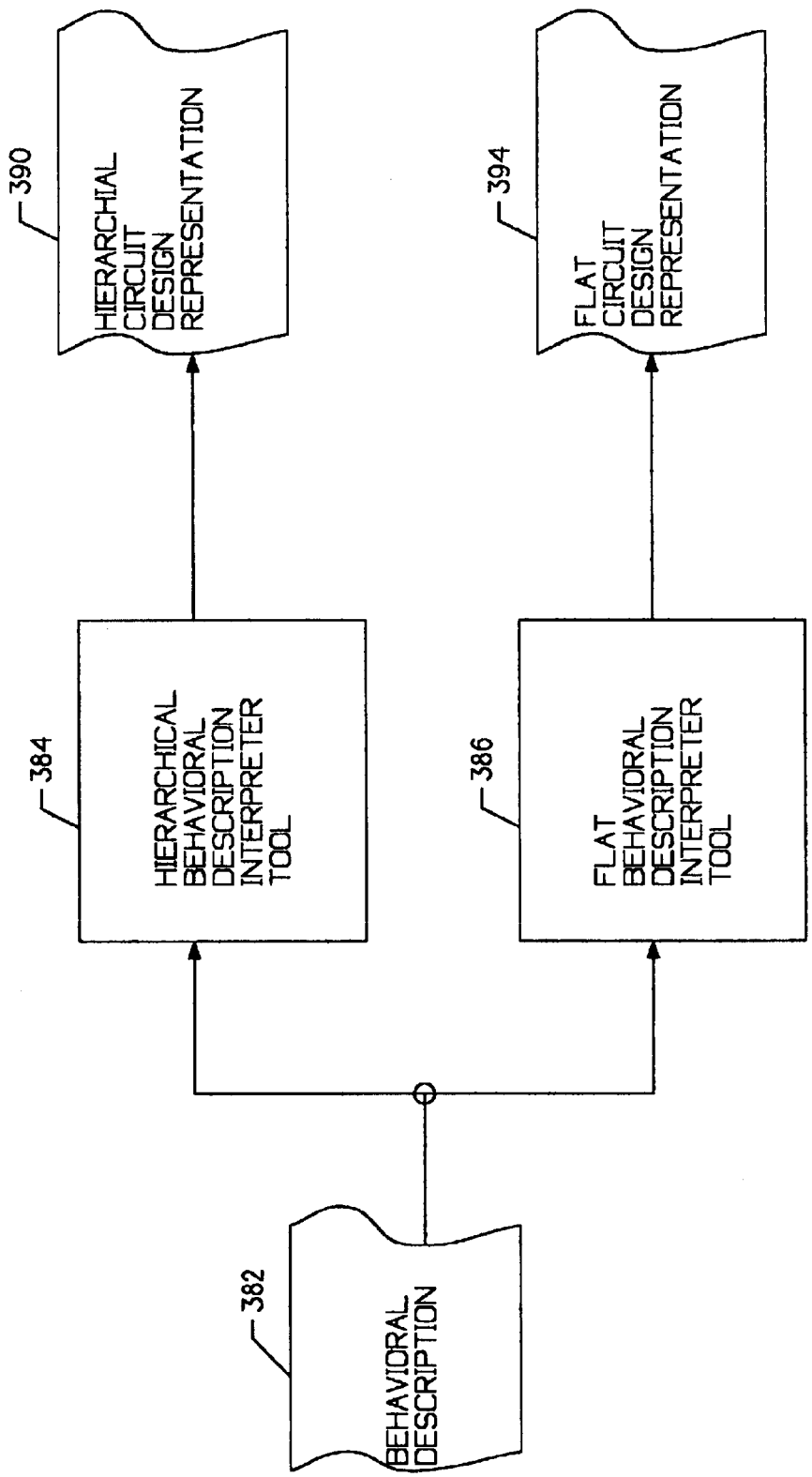
FIG. 14 is a block diagram showing another illustrative embodiment of the present invention.

FIG. 14 is a block diagram showing another illustrative embodiment of the present invention. A behavioral description 382 may include a number of hierarchical statements therein. The hierarchical statements are provided such that they are identifiable, and preferably with an identifiable syntax. A hierarchical behavioral description interpreter tool 384 may read the behavioral description 382 and interpret the hierarchical statements therein. The hierarchical behavioral description interpreter tool 384 may be a logic synthesis tool. The term tool as used herein refers to a software program running on a data processing system or an application specific data processing system. The hierarchical behavioral description interpreter tool 384 may then provide a circuit design representation 390 that includes the corresponding hierarchy.

A flat behavioral description interpreter tool 386 reads the behavioral description 382 and effectively disregards the hierarchical statements therein. The flat behavioral description interpreter tool may be an HDL logic synthesis tool. The flat behavioral description interpreter tool 386 then provides a circuit design representation 394 that does not include the corresponding hierarchy. In some cases, this may result in a flat circuit design representation.

Figure 15:
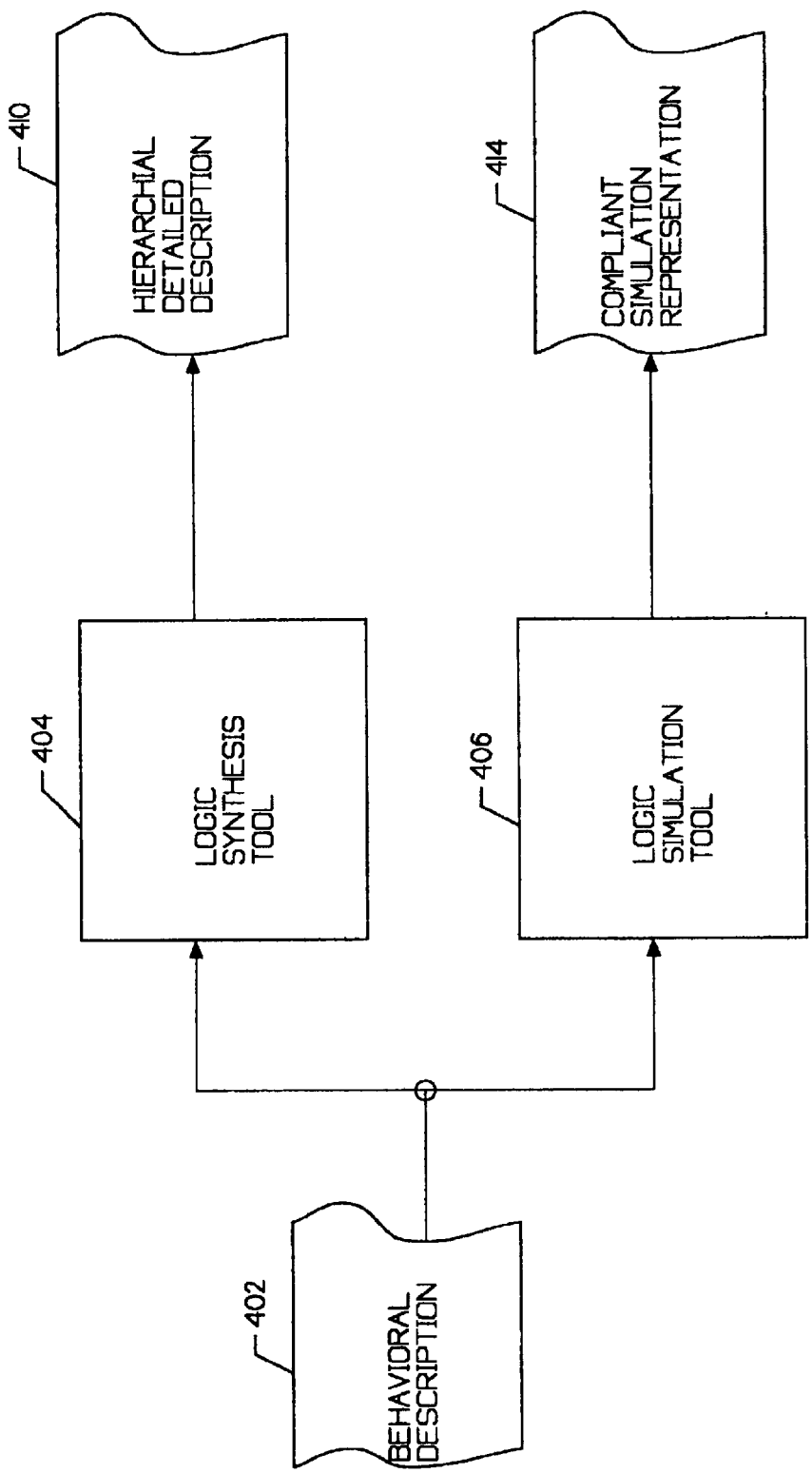
FIG. 15 is a block diagram showing yet another illustrative embodiment of the present invention.

FIG. 15 is a block diagram showing yet another illustrative embodiment of the present invention. A behavioral description 402 may include a number of hierarchical statements therein. The hierarchical statements are provided such that they are identifiable, and preferably with an identifiable syntax. A logic synthesis tool 404 may read the behavioral description 402 and interpret the hierarchical statements therein. The term tool as used herein refers to a software program running on a data processing system or an application specific data processing system. The logic synthesis tool 404 may then provide a circuit design representation 410 that includes the corresponding hierarchy.

A logic simulation tool 406 reads the behavioral description 402 and effectively disregards the hierarchical statements therein. The logic simulation tool 406 then provides a circuit design representation 414 that does not include the corresponding hierarchy. In some cases, this may result in a flat circuit design representation.

As can readily be seen, the present invention contemplates providing a number of hierarchical statements in a behavioral description of the circuit design, wherein selected hierarchical statements are visible when providing a first representation of the circuit design and effectively invisible when providing a second representation of the circuit design.

Having thus described the preferred embodiments of the present invention, those of skill in the art will readily appreciate that the teachings found herein may be applied to yet other embodiments within the scope of the claims hereto attached.

What is claimed is:

1. A method for selectively providing a hierarchy to a circuit design, wherein the circuit design is initially described in a behavioral description including a number of behavioral statements, the method comprising the steps of:
   a. providing a number of hierarchical statements in the behavioral description of the circuit design, wherein selected ones of the hierarchical statements are identifiable;
   b. reading the behavioral description; interpreting the selected ones of the hierarchical statements that are identifiable; and providing the corresponding hierarchy in a first representation of the circuit design; and
   c. reading the behavioral description; effectively disregarding the selected ones of the hierarchical statements that are identifiable; and not providing the corresponding hierarchy in a second representation of the circuit design.

2. A method according to claim 1 wherein the number of behavioral statements are VHDL statements.

3. A method according to claim 1 wherein the selected ones of the hierarchical statements that are identifiable have a predetermined syntax, wherein the predetermined syntax identifies the corresponding hierarchical statements from the number of behavioral statements.

4. A method according to claim 3 wherein the predetermined syntax includes a hierarchical statement identifier surrounded by one or more squiggly brackets.

5. A method according to claim 1 wherein the number of behavioral statements are UDSL statements.

6. A method according to claim 5 wherein the selected ones of the hierarchical statements that are identifiable have a predetermined syntax, wherein the predetermined syntax identifies the corresponding hierarchical statements from the number of behavioral statements.

7. A method according to claim 6 wherein the predetermined syntax includes a hierarchical statement identifier surrounded by one or more squiggly brackets.

8. A method according to claim 1 wherein step 1(b) is performed by a logic synthesizer tool.

9. A method according to claim 8 wherein the first representation of the circuit design is a detailed description of the circuit design.

10. A method according to claim 9 wherein a placement tool physically places selected hierarchical regions of the detailed description on a scaled representation of an integrated circuit die.

11. A method according to claim 1 wherein step 1(c) is performed by a logic simulator tool.

12. A method according to claim 11 wherein the logic simulator tool is a VHDL compatible simulator tool.

13. A method according to claim 11 wherein the second representation of the circuit design is a compiled description of the circuit design that is compatible with the simulator tool.

14. A method according to claim 13 further comprising the step of:
 a. providing a number of test vectors; and
 b. logically simulating the compiled description of the circuit design using the number of test vectors.

15. A method for selectively providing a hierarchy to a circuit design, wherein the circuit design is initially described in a behavioral description including a number of statements, the behavioral description being operated on by a first circuit design tool and a second circuit design tool, the method comprising the steps of:
 a. providing a number of hierarchical statements in the behavioral description, wherein selected ones of the number of hierarchical statements are interpreted by the first circuit design tool and effectively disregarded by the second circuit design tool.

16. A method according to claim 15 wherein the selected ones of the number of hierarchical statements are identifiable from the remaining number of statements.

17. A method according to claim 16 wherein the selected ones of the number of hierarchical statements are identifiable by a predetermined syntax.

18. A method according to claim 17 wherein the predetermined syntax includes a hierarchical statement identifier surrounded by one or more squiggly brackets.

19. A method according to claim 15 wherein the first circuit design tool is a logic synthesis tool.

20. A method according to claim 19 wherein the second circuit design tool is a logic simulation tool.

21. An apparatus for selectively providing a hierarchy to a circuit design, wherein the circuit design is initially described in a behavioral description including a number of statements, comprising:
 a. providing means for providing a number of hierarchical statements in the behavioral description of the circuit design, wherein selected ones of the hierarchical statements are identifiable;
 b. first behavioral description interpreter means coupled to said providing means for reading the behavioral description; interpreting the selected ones of the hierarchical statements that are identifiable; and providing the corresponding hierarchy in a first representation of the circuit design; and
 c. second behavioral description interpreter means coupled to said providing means for reading the behavioral description; effectively disregarding the selected ones of the hierarchical statements that are identifiable; and not providing the corresponding hierarchy in a second representation of the circuit design.

22. An apparatus according to claim 21 wherein said providing means provides the selected ones of the hierarchical statements in a predetermined syntax.

23. An apparatus according to claim 22 wherein the selected ones of the hierarchical statements are identifiable by the predetermined syntax.

24. An apparatus according to claim 23 wherein the predetermined syntax includes a hierarchical statement identifier surrounded by one or more squiggly brackets.

25. An apparatus according to claim 21 wherein said first behavioral description interpreter means comprises a logic synthesis means.

26. An apparatus according to claim 21 wherein said second behavioral description interpreter means comprises a logic simulation means.

27. An apparatus for selectively providing a hierarchy to a circuit design, wherein the circuit design is initially described in a behavioral description including a number of statements, wherein selected ones of the number of statements are hierarchical statements, comprising:
 a. a first behavioral description interpreter tool, wherein the first behavioral description interpreter tool interprets selected ones of the hierarchical statements, and provides the corresponding hierarchy in a first representation of the circuit design; and
 b. a second behavioral description interpreter tool, wherein the second behavioral description interpreter tool effectively disregards selected ones of the hierarchical statements, and does not provide the corresponding hierarchy in a second representation of the circuit design.

28. An apparatus according to claim 27 wherein said first behavioral description interpreter tool comprises a logic synthesis tool.

29. An apparatus according to claim 27 wherein said second behavioral description interpreter means comprises a logic simulation tool.

30. An apparatus for selectively providing a hierarchy to a circuit design, wherein the circuit design is initially described in a behavioral description including a number of statements, wherein selected ones of the number of statements are hierarchical statements, comprising:
 b. a logic synthesis tool, wherein the logic synthesis tool interprets selected ones of the hierarchical statements, and provides the corresponding hierarchy in a detailed description of the circuit design; and
 c. a logic simulation tool, wherein the logic simulation tool effectively disregards selected ones of the hierarchical statements, and does not provide the corresponding hierarchy in a logic simulation representation of the circuit design.

* * * * *